US009230969B2

(12) United States Patent
Tsuboi

(10) Patent No.: US 9,230,969 B2
(45) Date of Patent: Jan. 5, 2016

(54) SEMICONDUCTOR DEVICE

(71) Applicant: RENESAS ELECTRONICS CORPORATION, Kanagawa (JP)

(72) Inventor: Nobuo Tsuboi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/672,882

(22) Filed: Mar. 30, 2015

(65) Prior Publication Data

US 2015/0206889 A1 Jul. 23, 2015

Related U.S. Application Data

(62) Division of application No. 13/471,997, filed on May 15, 2012, now Pat. No. 9,000,503.

(30) Foreign Application Priority Data

May 24, 2011 (JP) ................................. 2011-115841

(51) Int. Cl.
*H01L 27/11* (2006.01)
*H01L 21/8244* (2006.01)
(Continued)

(52) U.S. Cl.
CPC ...... *H01L 27/1104* (2013.01); *H01L 21/76808* (2013.01); *H01L 23/4827* (2013.01); *H01L 23/50* (2013.01); *H01L 27/0207* (2013.01); *H01L 27/105* (2013.01); *H01L 27/11* (2013.01); *H01L 27/1116* (2013.01); *H01L 2924/0002* (2013.01); *Y10S 257/903* (2013.01)

(58) Field of Classification Search
CPC . H01L 27/11; H01L 27/1104; H01L 27/1116; H01L 27/105
See application file for complete search history.

(56) References Cited

U.S. PATENT DOCUMENTS 5,774,393 A * 6/1998 Kuriyama ............ G11C 11/419
365/154
5,930,163 A * 7/1999 Hara .................... H01L 27/1104
257/903

(Continued)

FOREIGN PATENT DOCUMENTS

JP 10-178110 A 6/1998
JP 2007-103862 A 4/2007
(Continued)

OTHER PUBLICATIONS

Notice of Allowance U.S. Appl. No. 13/471,997 dated Dec. 4, 2014.
(Continued)

*Primary Examiner* — Marvin Payen
*Assistant Examiner* — Jeremy Joy
(74) *Attorney, Agent, or Firm* — McDermott Will & Emery LLP

(57) ABSTRACT

A semiconductor device in which wirings are formed adequately and electrical couplings are made properly in an SRAM memory cell. In the SRAM memory cell of the semiconductor device, a via to be electrically coupled to a third wiring as a word line is directly coupled to a contact plug electrically coupled to the gate wiring part of an access transistor. Also, another via to be electrically coupled to the third wiring as the word line is directly coupled to a contact plug electrically coupled to the gate wiring part of another access transistor.

10 Claims, 47 Drawing Sheets

(51) Int. Cl.
  *H01L 27/02* (2006.01)
  *H01L 27/105* (2006.01)
  *H01L 21/768* (2006.01)
  *H01L 23/482* (2006.01)
  *H01L 23/50* (2006.01)

(56) References Cited

U.S. PATENT DOCUMENTS

| | | | | |
|---|---|---|---|---|
| 7,064,398 | B2* | 6/2006 | Yokoyama | G11C 11/4125 257/379 |
| 7,145,194 | B2* | 12/2006 | Nishida | G11C 11/4125 257/296 |
| 7,439,153 | B2* | 10/2008 | Tsuboi | H01L 27/11 257/E21.661 |
| 8,013,385 | B2 | 9/2011 | Furumiya et al. | |
| 2003/0104674 | A1* | 6/2003 | Kasai | H01L 27/105 438/396 |
| 2003/0133335 | A1 | 7/2003 | Ohbayashi et al. | |
| 2005/0083756 | A1 | 4/2005 | Tomita et al. | |
| 2009/0052262 | A1* | 2/2009 | Nii | G11C 8/08 365/189.14 |
| 2010/0315889 | A1 | 12/2010 | Thomas et al. | |
| 2011/0278677 | A1* | 11/2011 | Otsuki | H01L 27/1104 257/369 |
| 2011/0299325 | A1* | 12/2011 | Kim | G11C 11/412 365/156 |
| 2012/0063213 | A1 | 3/2012 | Tomita et al. | |

FOREIGN PATENT DOCUMENTS

| | | |
|---|---|---|
| JP | 2010-135572 | 6/2010 |
| JP | 2010-183123 A | 8/2010 |
| WO | 2007/091541 A1 | 8/2007 |

OTHER PUBLICATIONS

Notification of Reasons for Refusal Japanese Patent Application No. 2011-115841 dated Sep. 30, 2014 with full English translation.

Non-Final Office Action U.S. Appl. No. 13/471,997 dated Aug. 28, 2014.

* cited by examiner

SEMICONDUCTOR DEVICE

CROSS-REFERENCE TO RELATED APPLICATIONS

This Application is a Divisional Application of U.S. Ser. No. 13/471,997 filed May 15, 2012, which claims priority from Japanese Patent Application No. 2011-115841 filed on May 24, 2011. The subject matter of each including the specification, drawings and abstract is incorporated herein by reference in its entirety.

BACKGROUND

The present invention relates to semiconductor devices and more particularly to a semiconductor device having a static random access memory.

In a semiconductor device called SOC (System On Chip), a logic circuit and a memory cell are mounted on a single chip. Given below is an explanation of a semiconductor device of that type which has an SRAM (Static Random Access Memory) memory cell.

The SRAM memory cell includes a flip-flop with two cross-coupled inverters and two access transistors. The flip-flop has two cross-coupled storage nodes. One access transistor is electrically coupled between one storage node and one bit line. The other access transistor is electrically coupled between the other storage node and the other bit line. The gates of the two access transistors are electrically coupled to a word line.

Also in the flip-flop, one driver transistor is electrically coupled between the one storage node and a grounding wiring and the other driver transistor is electrically coupled between the other storage node and the grounding wiring. One load transistor is electrically coupled between the one storage node and a voltage supply wiring and the other load transistor is electrically coupled between the other storage node and the voltage supply wiring.

The gate of the one driver transistor, the gate of the one load transistor, and the other storage node are electrically coupled to each other. Also, the gate of the other driver transistor, the gate of the other load transistor, and the one storage node are electrically coupled to each other.

In a region of a semiconductor substrate in which an SRAM memory cell is formed, two access transistors, two driver transistors and two load transistors are formed in prescribed element formation regions respectively. Above them, a multilayer interconnection structure including first, second and third wirings for coupling the transistors electrically is formed. The second wirings include bit lines and a voltage supply wiring. The third wirings include a word line and grounding wires.

One of the documents which disclose a multilayer interconnection structure is Japanese Unexamined Patent Publication No. 2010-135572. One of the documents which disclose an SRAM is Japanese Unexamined Patent Publication No. 2007-103862.

SUMMARY

However, the semiconductor devices of the related art have the following problem. The recent semiconductor devices tend to use copper wirings for interconnection. The copper wirings are formed by a damascene technique. Specifically, a wiring trench is formed in an interlayer insulating film in a way to match an interconnection pattern and copper film, etc. is filled in the wiring trench to make a wiring.

For a photo-mask used in photoengraving for making a wiring trench, a pattern subjected to optical correction called Optical Proximity Correction (OPC) is formed in a light shielding film in order to accurately make a resist pattern which corresponds to the design interconnection pattern.

In the above semiconductor device with the logic circuit and SRAM memory cell mounted on a single chip, the wirings formed in the SRAM memory cell region are arranged more densely than the wirings formed in the logic circuit region. Furthermore, in the SRAM memory cell region, the first wirings are arranged more densely than the second and third wirings.

For this reason, in connection with the first wirings, in some cases, particularly for a design pattern of relatively short wirings, optical proximity correction could not be made adequately because of the relation between short first wirings and other adjacent first wirings, resulting in failure to make a resist pattern (wiring trench pattern) for the design wiring pattern accurately. Moreover, there were cases that copper film or the like could not be properly filled in the wiring trench made using such a resist pattern as a mask and desired first wirings could not be formed. As a consequence, the SRAM memory cell cannot function properly.

The present invention has been made in order to solve the above problem and an object of the invention is to provide a semiconductor device in which in an SRAM memory cell, wirings are formed adequately and electrical couplings are made properly.

According to a first aspect of the present invention, there is provided a semiconductor device having a static random access memory cell which includes a plurality of element formation regions, access transistors including a first access transistor and a second access transistor, driver transistors including a first driver transistor and a second driver transistor, and load transistors including a first load transistor and a second load transistor, a plurality of contact plugs, a plurality of first wirings, a plurality of first vias, a plurality of second wirings, and a plurality of third wirings. The element formation regions are each defined on a main surface of a semiconductor substrate. The contact plugs are formed so as to be electrically coupled to prescribed parts of the access transistors, the driver transistors, and the load transistors respectively. The first wirings are each formed so as to be electrically coupled to a prescribed contact plug among the contact plugs. The first vias are each formed so as to be electrically coupled to a prescribed contact plug among the contact plugs. The second wirings are each formed so as to be electrically coupled to a prescribed first via among the first vias and include a first bit line and a second bit line as bit lines for inputting and outputting data and a voltage supply wiring. The third wirings are each formed so as to be electrically coupled to a prescribed second wiring among the second wirings and include a word line and a grounding wiring. The first access transistor is electrically coupled between a first storage node for storing data and the first bit line, and the second access transistor is electrically coupled between a second storage node for storing data and the second bit line. The gate of the first access transistor and the gate of the second access transistor are electrically coupled to the word line. The first driver transistor is electrically coupled between the first storage node and the grounding wiring and the second driver transistor is electrically coupled between the second storage node and the grounding wiring. The first load transistor is electrically coupled between the first storage node and the voltage supply wiring and the second load transistor is electrically coupled between the second storage node and the voltage supply wiring. Among the contact plugs, at least one of a first contact plug electrically coupled to the gate of each of the access transistors and a second contact plug, located on a side of each of the driver transistors for coupling to the grounding wiring, and among the first vias, a first via first part for electrically coupling either the first contact plug or the second contact plug to a prescribed second wiring first part among the second wirings are electrically coupled so that the first via first part is in direct contact with either the first contact plug or the second contact plug.

According to a second aspect of the present invention, there is provided a semiconductor device having a static random access memory cell which includes a plurality of element formation regions, access transistors including a first access transistor and a second access transistor, driver transistors including a first driver transistor and a second driver transistor, and load transistors including a first load transistor and a second load transistor, a plurality of contact plugs, a plurality of first wirings, a plurality of first vias, a plurality of second wirings, and a plurality of third wirings. The element formation regions are each defined on a main surface of a semiconductor substrate. The contact plugs are formed so as to be electrically coupled to prescribed parts of the access transistors, the driver transistors, and the load transistors respectively. The first wirings are each formed so as to be electrically coupled to a prescribed contact plug among the contact plugs. The first vias are each formed so as to be electrically coupled to a prescribed contact plug among the contact plugs. The second wirings are each formed so as to be electrically coupled to a prescribed first via among the first vias and include a first bit line and a second bit line as bit lines for inputting and outputting data and a voltage supply wiring. The third wirings are each formed so as to be electrically coupled to a prescribed second wiring among the second wirings and include a word line and a grounding wiring. The first access transistor is electrically coupled between a first storage node for storing data and the first bit line, and the second access transistor is electrically coupled between a second storage node for storing data and the second bit line. The gate of the first access transistor and the gate of the second access transistor are electrically coupled to the word line. The first driver transistor is electrically coupled between the first storage node and the grounding wiring and the second driver transistor is electrically coupled between the second storage node and the grounding wiring. The first load transistor is electrically coupled between the first storage node and the voltage supply wiring and the second load transistor is electrically coupled between the second storage node and the voltage supply wiring. Among the contact plugs, at least one of a first contact plug located on a side of each of the access transistors for coupling to the bit line and a second contact plug located on a side of each of the load transistors for coupling to the voltage supply wiring and among the first vias, a first via first part for electrically coupling either the first contact plug or the second contact plug to a prescribed second wiring first part among the second wirings are electrically coupled so that the first via first part is in direct contact with either the first contact plug or the second contact plug.

In the semiconductor device according to the first aspect of the present invention, in an SRAM memory cell, wirings are formed adequately and electrical couplings are made properly.

In the semiconductor device according to the second aspect of the present invention, wirings can be formed adequately in an SRAM memory cell and electrical couplings can be made properly.

DETAILED DESCRIPTION

First Embodiment

Next, an explanation will be given of three variations (first to third examples) of the semiconductor device in which among the first wirings of an SRAM memory cell, specific first wirings adjacent to relatively short first wirings are eliminated and vias corresponding to them are directly coupled to contact plugs.

Figure 1:
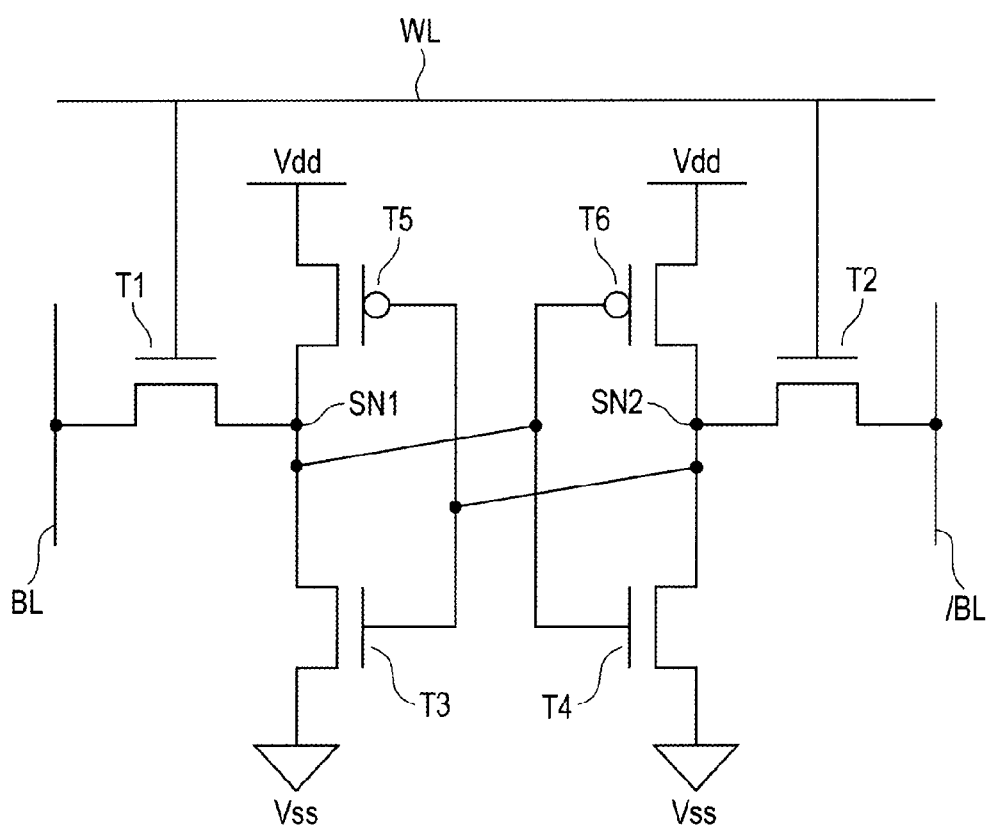
FIG. 1 shows the equivalent circuit of an SRAM memory cell in a semiconductor device according to each embodiment of the present invention.

First, the equivalent circuit of the SRAM memory cell will be described. As shown in FIG. 1, the SRAM memory cell includes a flip-flop with two cross-coupled inverters and two access transistors T1 and T2. The flip-flop has two storage nodes SN1 and SN2 which are cross-coupled. The access transistor T1 (T2) is coupled between the storage node SN1 (SN2) and bit line BL (/BL). The gates of the access transistor T1 and T2 are coupled to a word line WL.

In the flip-flop, a driver transistor T3 (T4) is coupled between the storage node SN1 (SN2) and grounding wire (Vss). Also a load transistor T5 (T6) is coupled between the storage node SN1 (SN2) and voltage supply line (Vdd). The gate of the driver transistor T3, the gate of the load transistor T5 and the storage node SN2 are electrically coupled to each other. The gate of the driver transistor T4, the gate of the load transistor T6 and the storage node SN1 are electrically coupled to each other.

Before reading or writing data, both the bit lines BL and /BL are precharged to the H level. For example, if the memory cell stores the H level and L level in the storage nodes SN1 and SN2 respectively, to read data, the driver transistor T4, when turned on, pulls the charge on the bit line /BL through the access transistor T2 to decrease the potential of the bit line /BL. A sense amplifier (not shown) detects a drop in the voltage of the bit line /BL. To rewrite data in the memory cell, a light driver (not shown) pulls the charge in the storage node SN1 through the bit line BL charged to the H level and access transistor T1.

FIRST EXAMPLE

Figure 2:
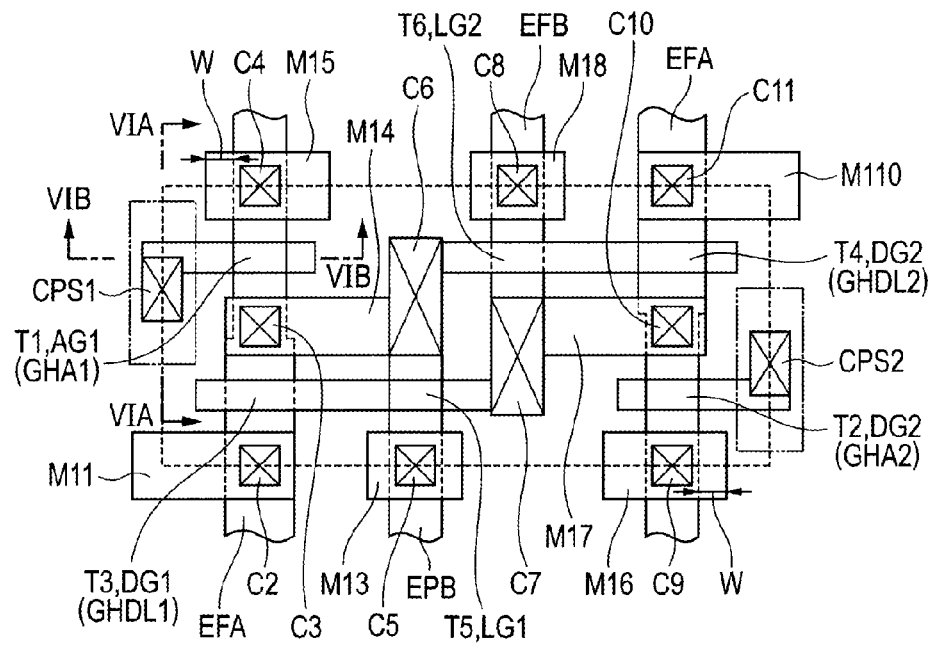
FIG. 2 is a plan view showing how the transistors and first wirings are interconnected in an SRAM memory cell of a semiconductor device according to a first example of a first embodiment of the present invention.
Figure 3:
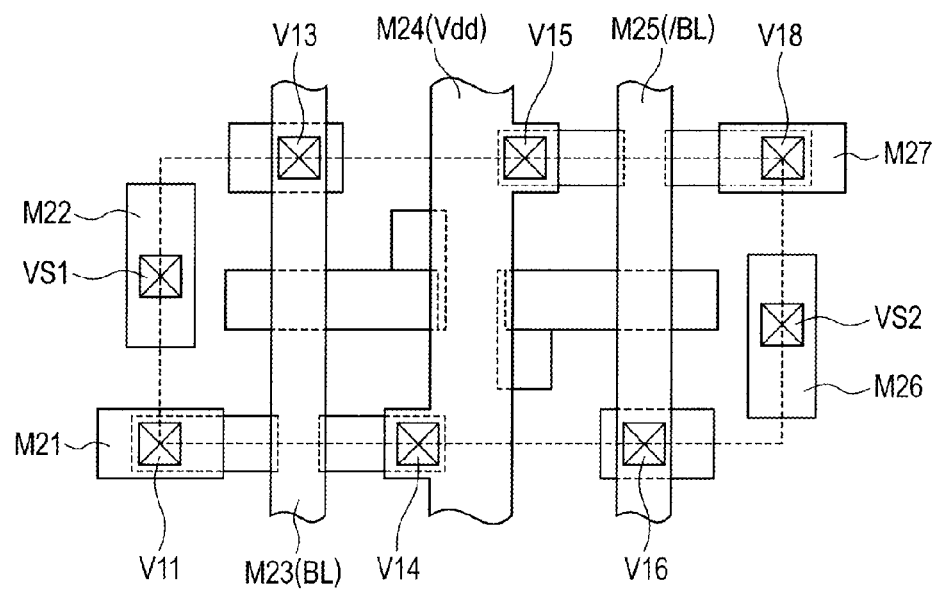
FIG. 3 is a plan view showing how the first and second wirings are interconnected in the first example of the first embodiment.
Figure 4:
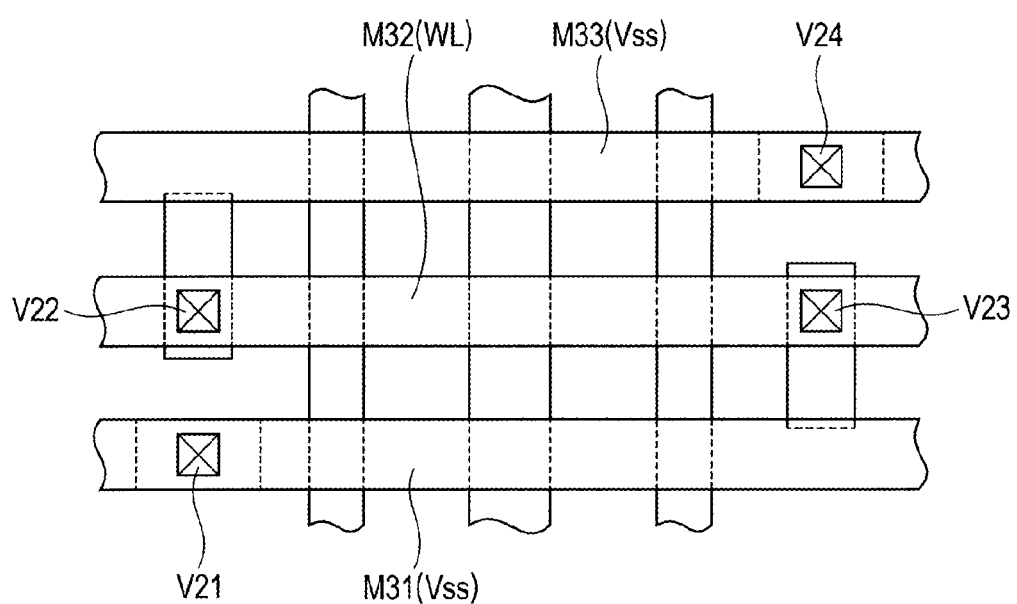
FIG. 4 is a plan view showing how the second and third wirings are interconnected in the first example of the first embodiment.
Figure 5:
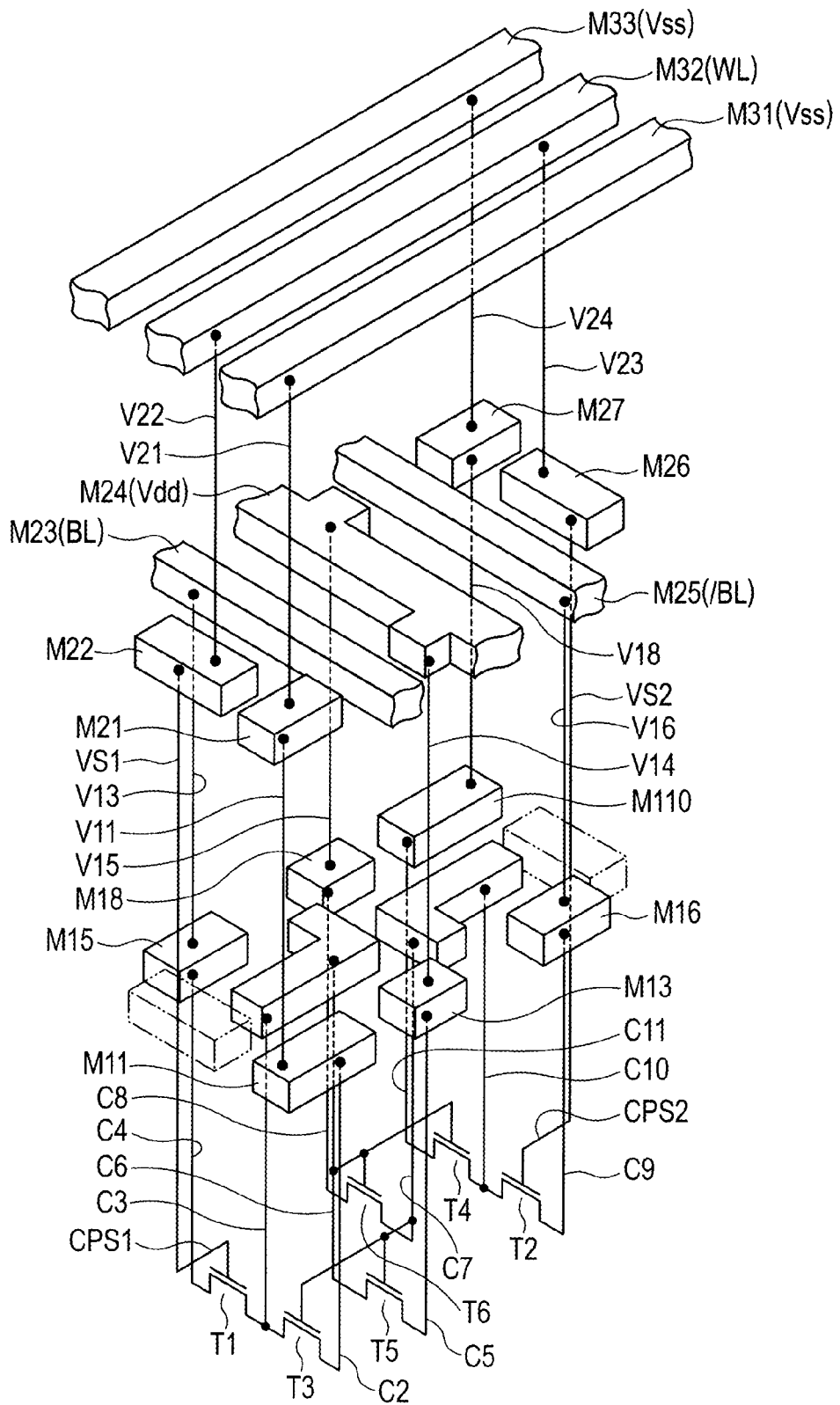
FIG. 5 is an exploded perspective view of the multilayer interconnection structure of the SRAM memory cell in the first example of the first embodiment

Next, the multilayer interconnection structure of an SRAM memory cell in a semiconductor device according to the first example will be described. FIG. 2 shows how the transistors and first wirings are interconnected (plan view) and FIG. 3 shows how the first and second wirings are interconnected (plan view). FIG. 4 shows how the second and third wirings are interconnected (plan view) and FIG. 5 is an exploded perspective view of the whole multilayer interconnection structure.

As shown in FIGS. 2 to 5, in the SRAM memory cell of this semiconductor device, a contact plug CPS1 electrically coupled to the gate wiring part GHA1 of the access transistor T1 is directly coupled to a via VS1 to be electrically coupled to the third wiring M32 as the word line. Also, a contact plug CPS2 electrically coupled to the gate wiring part GHA2 of the access transistor T2 is directly coupled to a via VS2 to be electrically coupled to the third wiring M32 as the word line.

In other words, among the first wirings, the first wirings for electrically coupling the access transistor gate wiring parts and the word line which are formed in an SRAM memory cell according to a comparative example (which will be described later) are not formed in this SRAM memory cell.

Therefore, the access gate electrode AG1 (gate wiring part GHA1) of the access transistor T1 is electrically coupled to the third wiring M32 as the word line WL through the contact plug CPS1, via VS1, second wiring M22 and via V22. Also the access gate electrode AG2 (gate wiring part GHA2) of the access transistor T2 is electrically coupled to the third wiring M32 as the word line WL through the contact plug CPS2, via VS2, second wiring M26 and via V23.

The source region or drain region of the access transistor T1 is electrically coupled to the second wiring M23 as the bit line BL through the contact plug C4, first wiring M15 and via V13. The other region (source or drain region) of the access transistor T1 is electrically connected through the contact plug C3, first wiring M14, and contact plug C6, to the source or drain region of the load transistor T5, the load gate electrode LG2 of the load transistor T6, and the drive gate electrode DG2 of the driver transistor T4. Also the other region (source or drain region) of the access transistor T1 is electrically coupled to the source or drain region of the driver transistor T3.

The other region (source or drain region) of the driver transistor T3 is electrically coupled to the third wiring M31 as the grounding wiring Vss with a grounding potential through the contact plug C2, first wiring M11, via V11, second wiring M21 and via V21. The other region (source or drain region) of the load transistor T5 is electrically coupled to the second wiring M24 as the voltage supply wiring (Vdd) with a supply voltage through the contact plug C5, first wiring M13, and via V14.

The source region or drain region of the access transistor T2 is electrically coupled to the second wiring M25 as the bit line /BL through the contact plug C9, first wiring M16, and via V16. The other region (source or drain region) of the access transistor T2 is electrically connected through the contact plug C10, first wiring M17, and contact plug C7 to the source or drain region of the load transistor T6, the load gate electrode LG1 of the load transistor T5, and the drive gate electrode DG1 of the driver transistor T3. Also the other region (source or drain region) of the access transistor T2 is electrically coupled to the source or drain region of the driver transistor T4.

The other region (source or drain region) of the driver transistor T4 is electrically coupled to the third wiring M33 as the grounding wiring Vss with a grounding potential through the contact plug C11, first wiring M110, via V18, second wiring M27, and via V24. The other region (source or drain region) of the load transistor T6 is electrically coupled to the second wiring M24 as the voltage supply wiring Vdd with a supply voltage through the contact plug C8, first wiring M18, and via V15. The contact plugs C3 and C6 constitute the storage node SN1 and the contact plugs C7 and C10 constitute the storage node SN2.

The logic circuit, etc. (not shown) is formed in a region other than the region where the SRAM memory cell is formed.

Next, an example of the method for manufacturing the above semiconductor device will be described. "SRA" in each process drawing represents a sectional view taken along the line VIA-VIA of FIG. 2 and "SRB" represents a sectional view taken along the line VIB-VIB of FIG. 2. Each process drawing also includes a sectional view of the logic circuit region.

Figure 6:
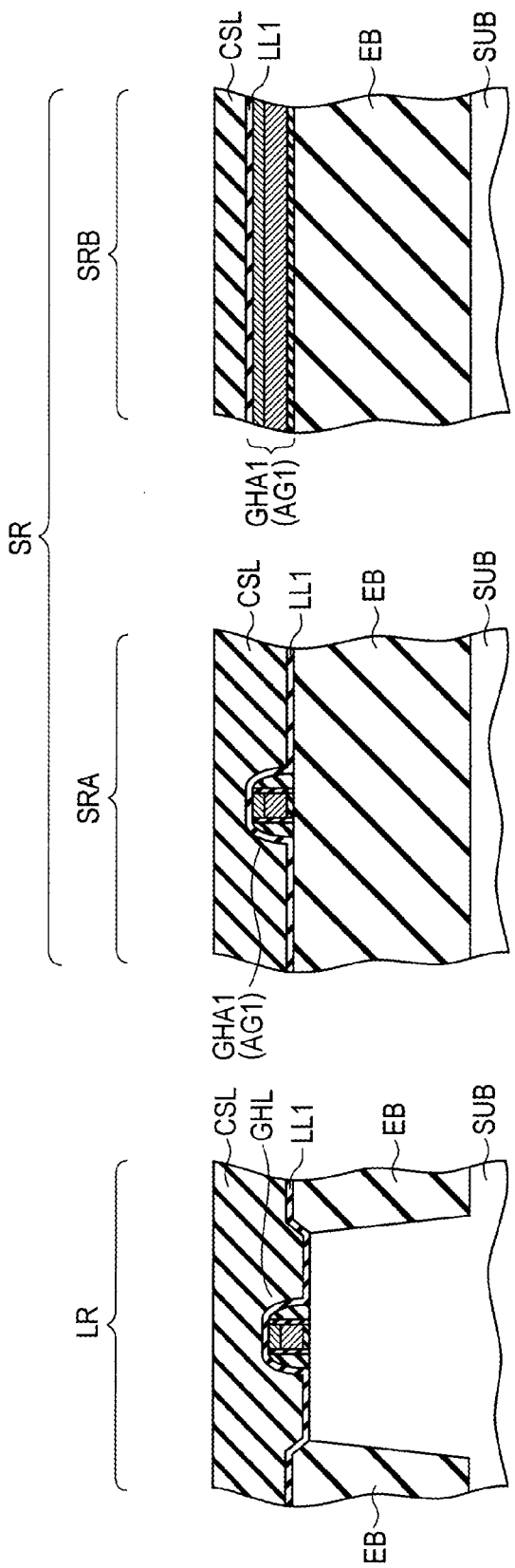
FIG. 6 is a sectional view showing a step in the method for manufacturing a semiconductor device in the first embodiment, including a cross section taken along the line VIA-VIA of FIG. 2 and a cross section taken along the line VIB-VIB of FIG. 2.

As shown in FIG. 6, an element isolation insulating film EB is formed in a given region of a semiconductor substrate SUB. Then, prescribed gate wiring parts GHA1, GHA2, GHDL1, and GHLD2 (FIG. 2) are formed in a way to cross the element formation regions EFA and EFB (FIG. 2) as defined by the element isolation insulating film EB.

On the other hand, the gate wiring part GHL of a transistor as a constituent of the logic circuit is formed in the logic circuit region LR in which the logic circuit is formed. Then, a liner film LL1 such as a silicon nitride film is formed in a way to cover the gate wiring part GHA1, etc. and gate wiring part GHL. Then, a contact interlayer insulating film CSL, for example, as a TEOS (Tetra Ethoxy Ortho Silicate glass) film or HDP (High Density Plasma) film is formed in a way to cover the liner film LL1.

Figure 7:
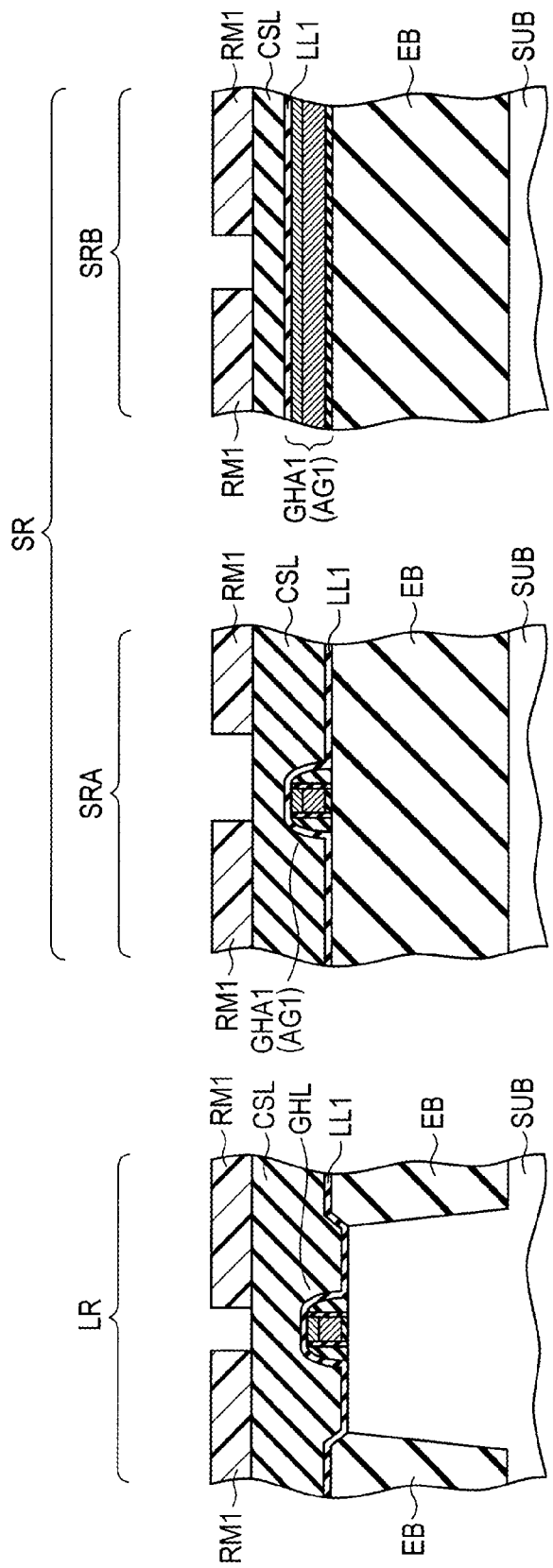
FIG. 7 is a sectional view showing a step to be taken after the step shown in FIG. 6 in the first embodiment.
Figure 8:
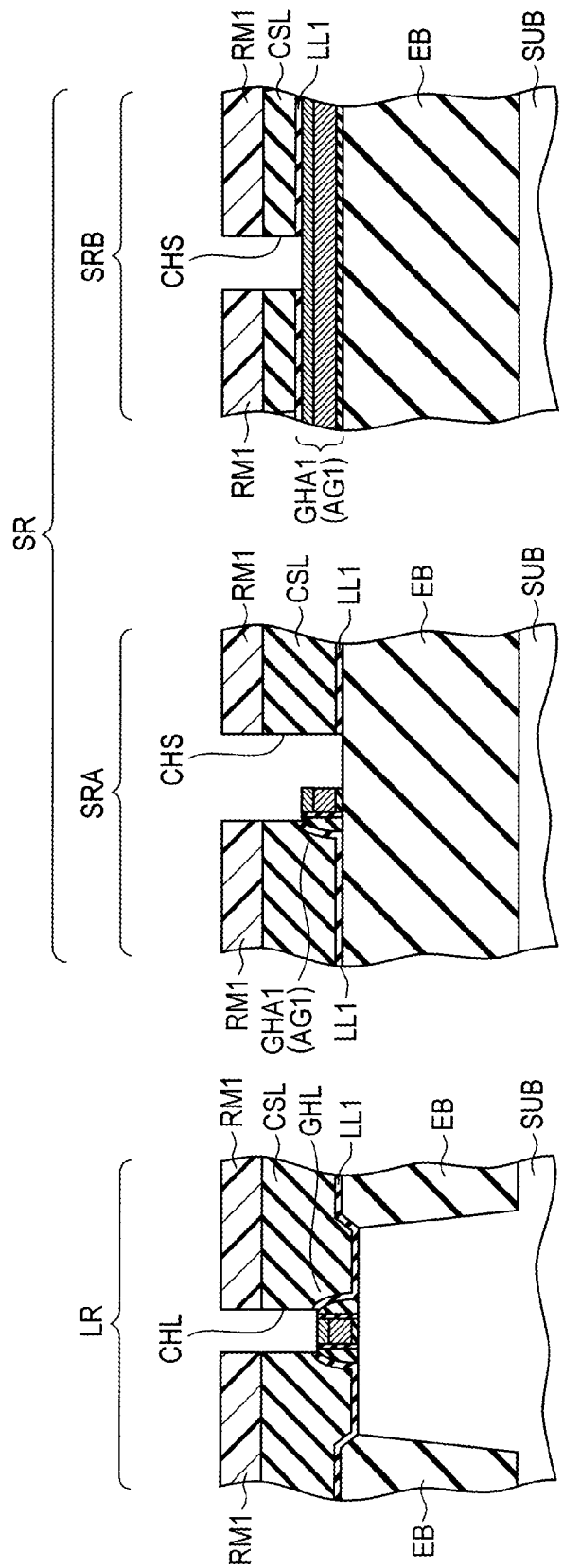
FIG. 8 is a sectional view showing a step to be taken after the step shown in FIG. 7 in the first embodiment.

Next, as shown in FIG. 7, a photoresist film RM1 for contact holes is formed by a given photoengraving process. Then, as shown in FIG. 8, a contact hole CHS which exposes the gate wiring part GHA1 is made by etching the contact interlayer insulating film CSL using the photoresist film RM1 as a mask. On the other hand, a contact hole CHL which exposes the gate wiring part GHL is made in the logic circuit region LR. After that, the photoresist film RM1 is removed.

Figure 9:
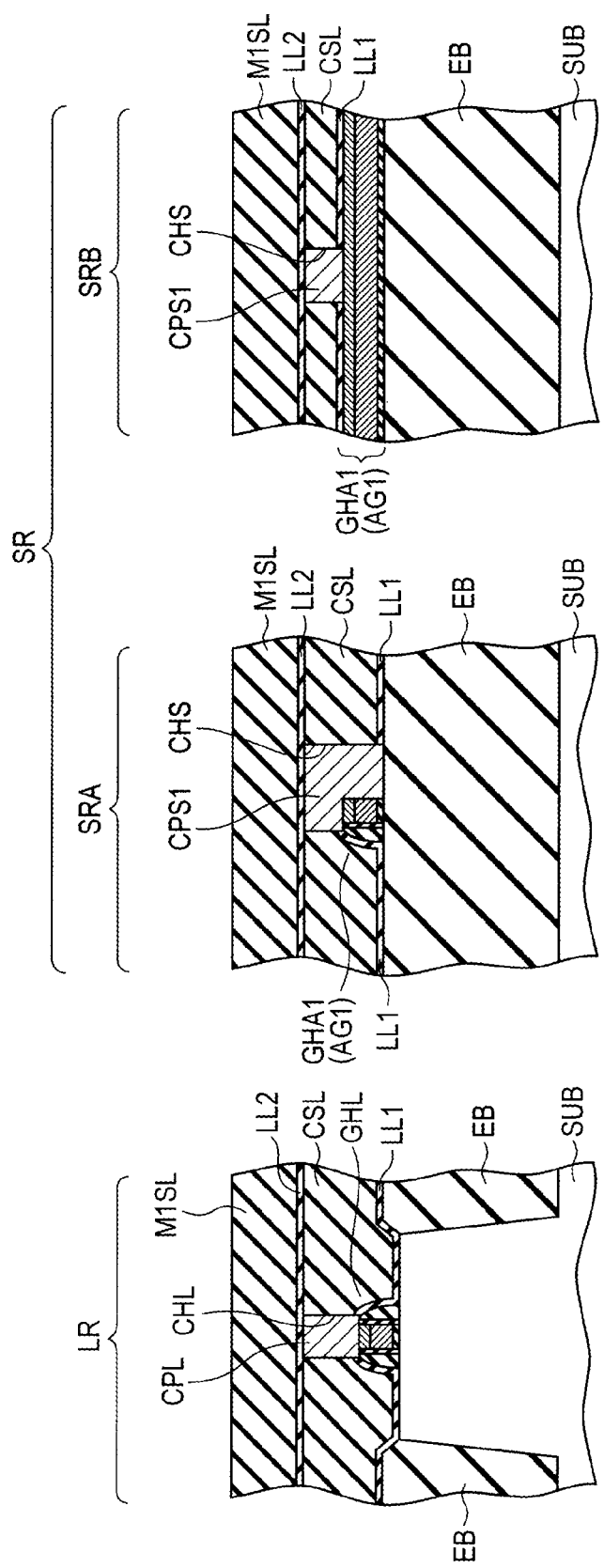
FIG. 9 is a sectional view showing a step to be taken after the step shown in FIG. 8 in the first embodiment.

Next, as shown in FIG. 9, in the memory cell region SR, a contact plug CPS1, for example, as a tungsten film or the like is formed in the contact hole CHS. In the logic circuit region LR, a contact plug CPL is formed in the contact hole CHL. Then, a liner film LL2 such as a silicon nitride film is formed in a way to cover the contact plugs CPS1 and CPL. Then, an M1 interlayer insulating film M1SL, for example, as a low-k film is formed in a way to cover the liner film LL2.

Figure 10:
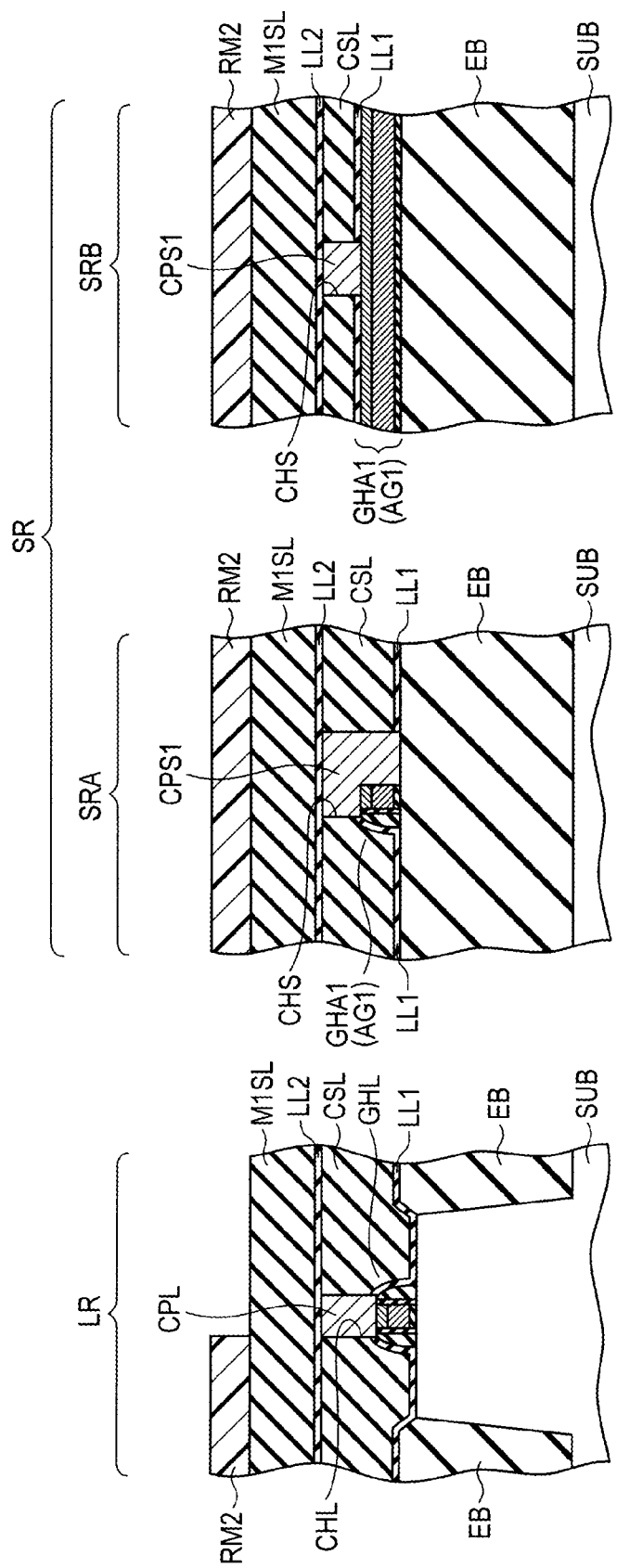
FIG. 10 is a sectional view showing a step to be taken after the step shown in FIG. 9 in the first embodiment.

Next, as shown in FIG. 10, a photoresist film RM2 for the formation of a wiring trench for first wirings is formed. Here, since the first wiring to be coupled to the contact plug CPS1 (CPS2) is not formed, the photoresist film RM2 is formed in a way to cover the part of the M1 interlayer insulating film M1SL lying just above the contact plug CPS1 (CPS2). Then, a wiring trench HTL1 (FIG. 11), etc. is formed by etching the M1 interlayer insulating film M1SL using the photoresist film RM2 as a mask. Then, the photoresist film RM2 is removed.

Figure 11:
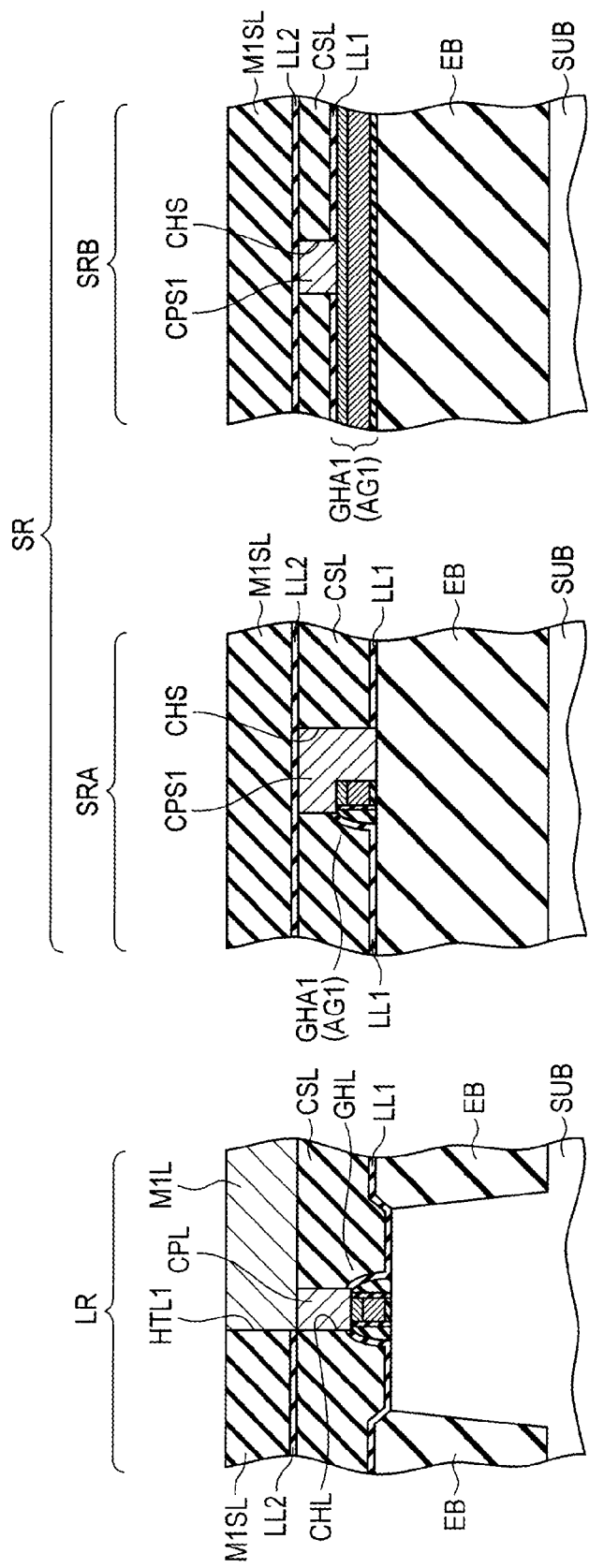
FIG. 11 is a sectional view showing a step to be taken after the step shown in FIG. 10 in the first embodiment.
Figure 12:
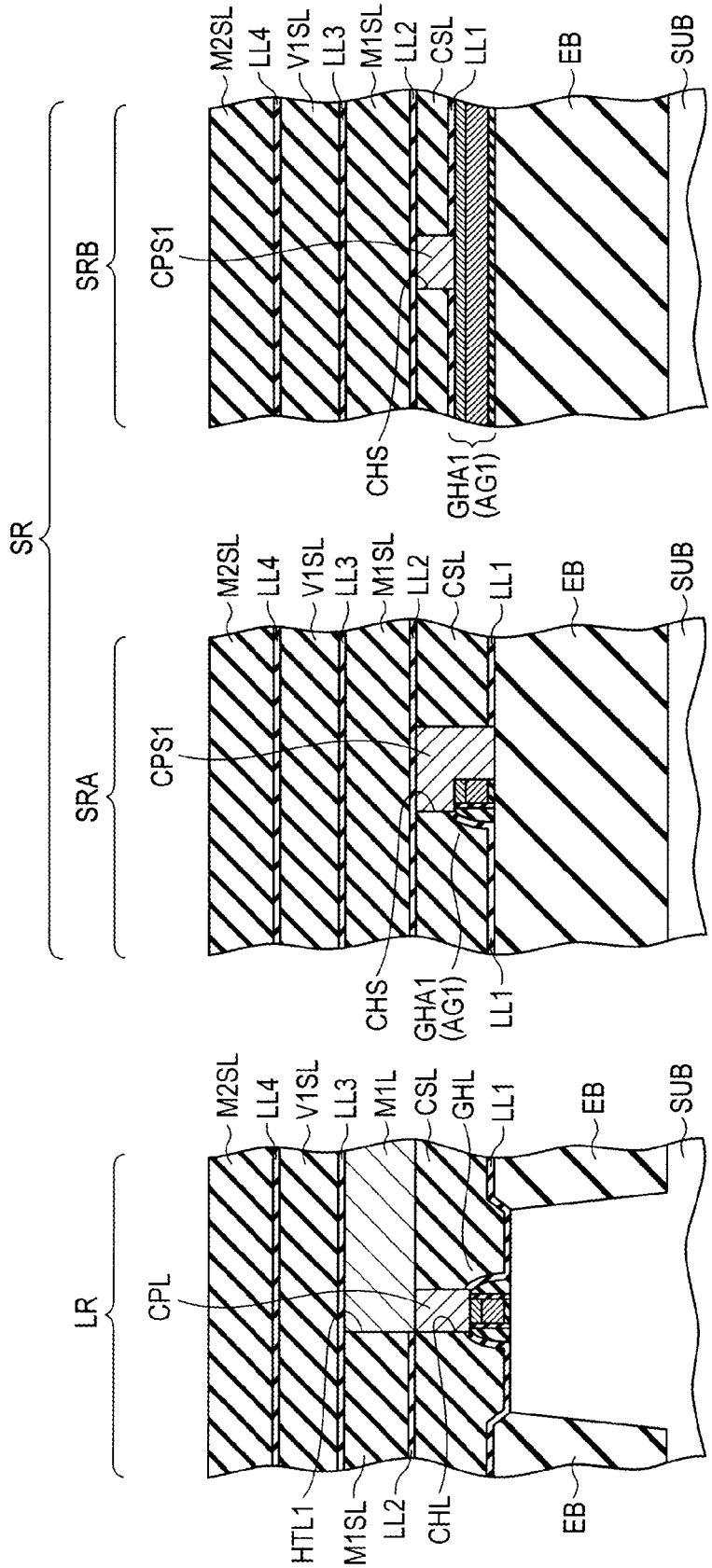
FIG. 12 is a sectional view showing a step to be taken after the step shown in FIG. 11 in the first embodiment.

Next, a copper film is formed by plating or another technique so as to fill the wiring trench HTL1, etc. Then, as shown in FIG. 11, a first wiring M1L, etc. is formed inside the wiring trench HTL1 by chemical mechanical polishing of the copper film. Then, as shown in FIG. 12, a liner film LL3 such as a silicon nitride film is formed over the M1 interlayer insulating film M1SL in a way to cover the first wiring M1L, etc. Then, a V1 interlayer insulating film V1SL as a low-k film is formed in a way to cover the liner film LL3. Then, a liner film LL4 such as a silicon nitride film is formed in a way to cover the V1 interlayer insulating film V1SL. Then, an M2 interlayer insulating film M2SL as a low-k film is formed in a way to cover the liner film LL4.

Figure 13:
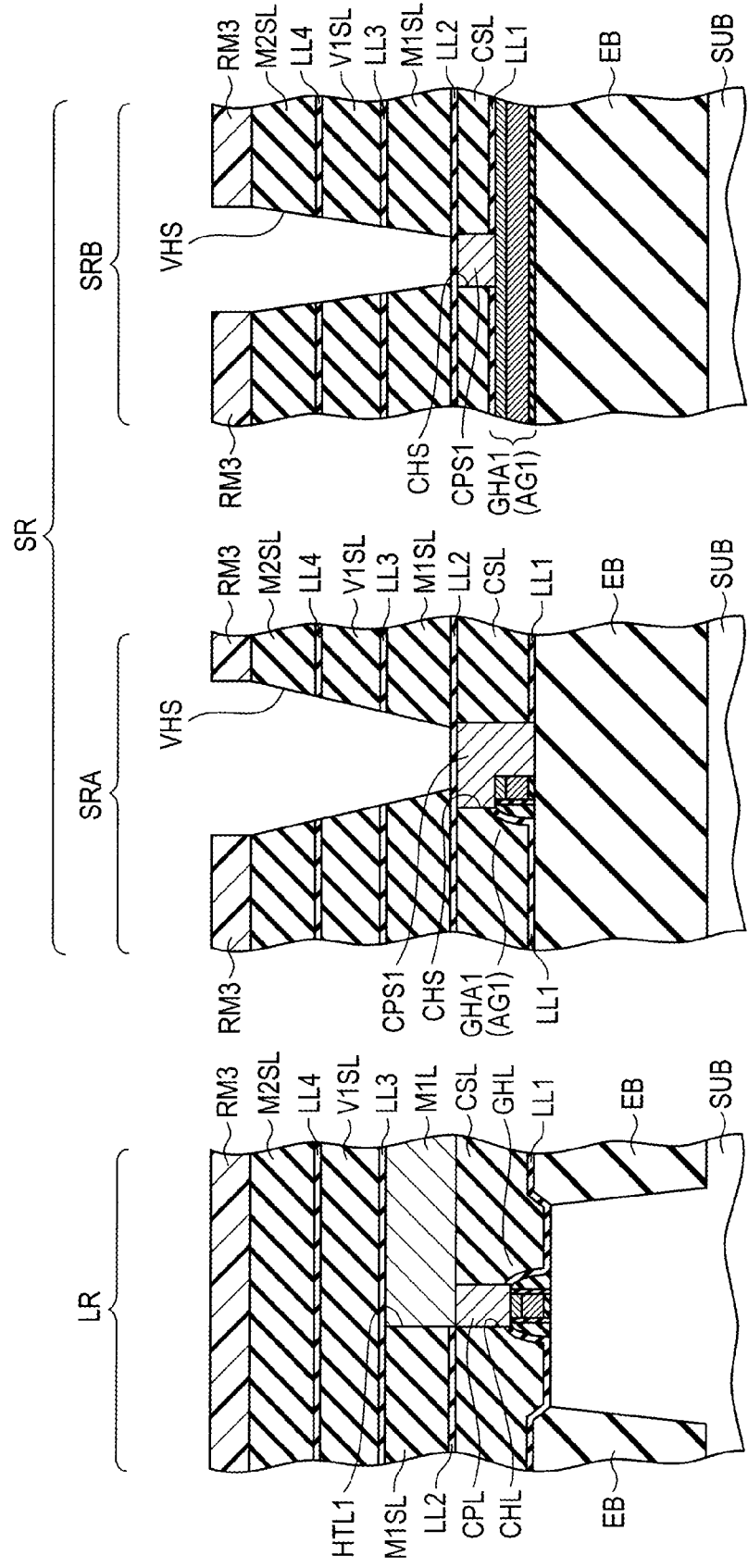
FIG. 13 is a sectional view showing a step to be taken after the step shown in FIG. 12 in the first embodiment.

Next, as shown in FIG. 13, a photoresist film RM3 is formed for the formation of a via to be coupled to the contact plug CPS1 (CPS2). Then, a via hole VHS which exposes the liner film LL2 is formed by etching the M2 interlayer insulating film M2SL, etc. using the photoresist film RM3 as a mask. Then, the photoresist film RM3 is removed.

Figure 14:
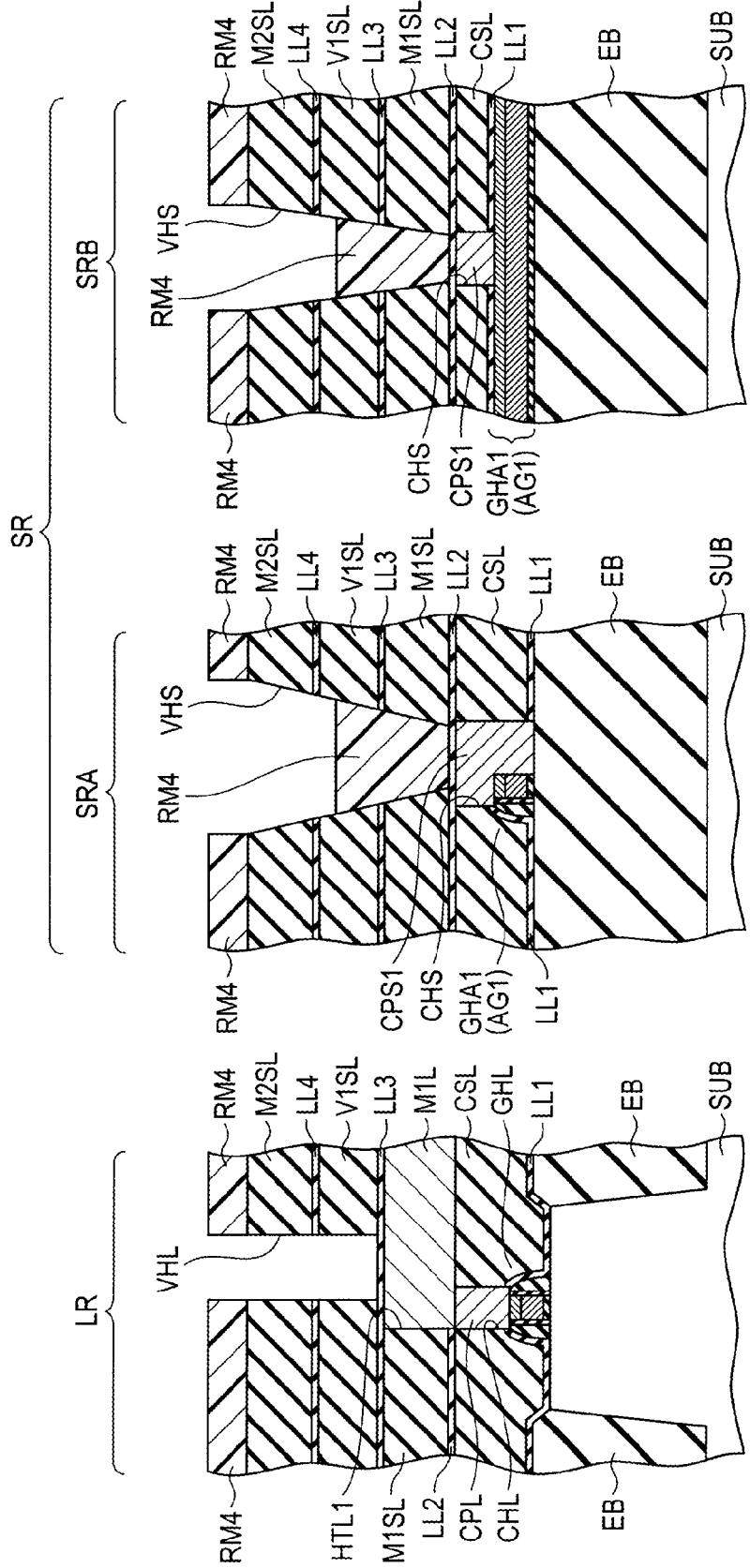
FIG. 14 is a sectional view showing a step to be taken after the step shown in FIG. 13 in the first embodiment.

Next, as shown in FIG. 14, a photoresist film RM4 is formed for the formation of a via to be coupled to a first wiring. At this time, part of the photoresist film RM4 is filled in the previously formed via hole VHS and it functions as a protective film. Then, a via hole VHL which exposes the liner film LL3 is formed in the logic circuit region LR by etching the M2 interlayer insulating film M2SL, etc. using the photoresist film RM4 as a mask.

At this time, a via hole (not shown) which exposes the part of the liner film LL3 lying just above the first wiring (not shown) is formed in the memory cell region MR. Part of the photoresist film RM4 is filled in the via hole VHS, which prevents damage to the bottom or similar part of the via hole VHS during etching for the formation of the via hole VHL.

Figure 15:
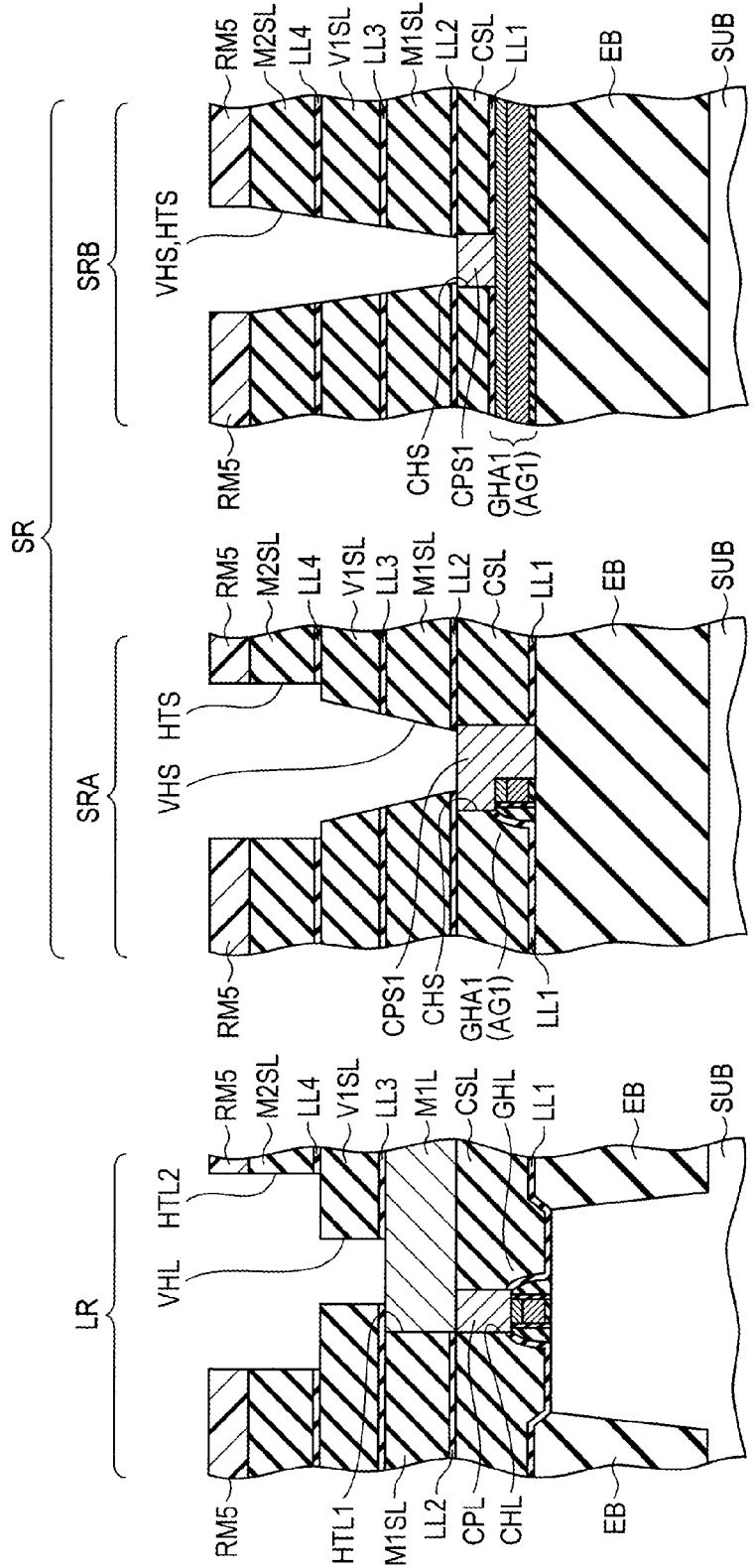
FIG. 15 is a sectional view showing a step to be taken after the step shown in FIG. 14 in the first embodiment.

Next, as shown in FIG. 15, a photoresist film RM5 is formed for the formation of a wiring trench for second wirings. Then, a wiring trench HTS is formed in the memory cell region SR by etching the M2 interlayer insulating film M2SL using the photoresist film RM5 as a mask. A wiring trench HTL2 is formed in the logic circuit region LR. Then, the photoresist film RM5 is removed.

Figure 16:
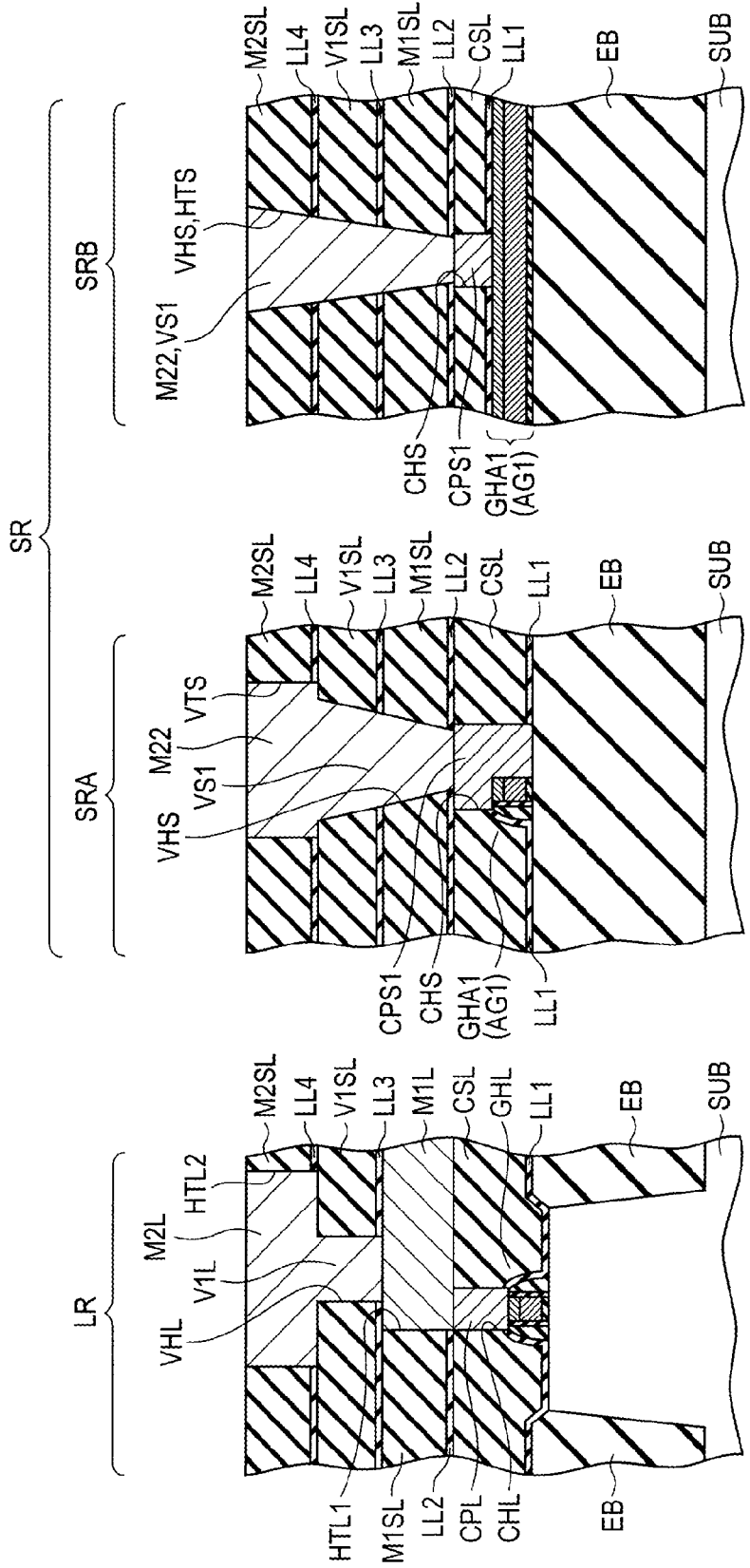
FIG. 16 is a sectional view showing a step to be taken after the step shown in FIG. 15 in the first embodiment.

Next, a copper film is formed by plating or another technique so as to fill the wiring trenches HTS and HTL2, etc. Then, as shown in FIG. 16, a second wiring M22 is formed inside the wiring trench HTS in the memory cell region SR by chemical mechanical polishing of the copper film. Also, in the memory cell region SR, second wirings M21 and M23 to M27 are formed in addition to the second wiring M22 (FIGS. 3 and 5). In the logic circuit region LR, a second wiring M2L is formed inside the wiring trench HTL2.

Next, a liner film (not shown), a V2 interlayer insulating film (not shown), and an M3 interlayer insulating film (not shown) are formed sequentially in a way to cover the second wirings HTS and HTL2, etc. Then, in the memory cell region SR, vias V21 to V24 (FIG. 5) are made in the V2 interlayer insulating film and third wirings M31 to M33 (FIG. 5) are formed in the M3 interlayer insulating film through a process similar to the above process in which vias and wirings have been formed in the V1 interlayer insulating film V1SL and M2 interlayer insulating film M2SL. Also, in the logic circuit region LR, prescribed vias and wirings (not shown) are formed. With the above steps, the main part of the semiconductor device having an SRAM memory cell is formed.

In the semiconductor device of the related art (comparative example), a first wiring for coupling the gate wiring part of an access transistor to the word line electrically is formed. In the above semiconductor device, such first wiring is not formed, which means that a relatively short first wiring located adjacent to that first wiring can be lengthened. This is explained below in reference to the semiconductor device according to the comparative example.

Figure 17:
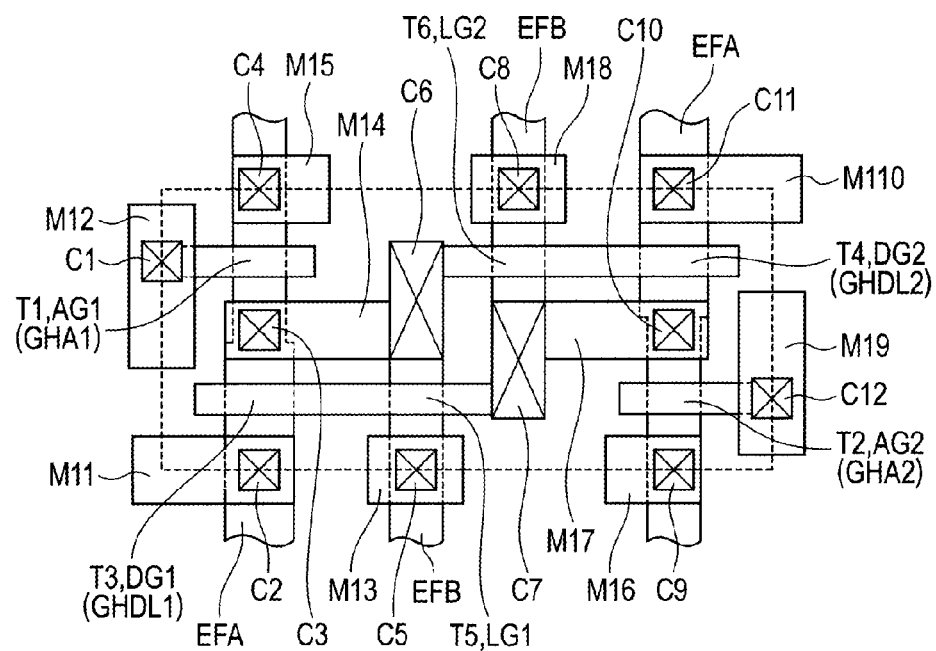
FIG. 17 shows how the transistors and first wirings are interconnected in a memory cell of a semiconductor device according to a comparative example.
Figure 18:
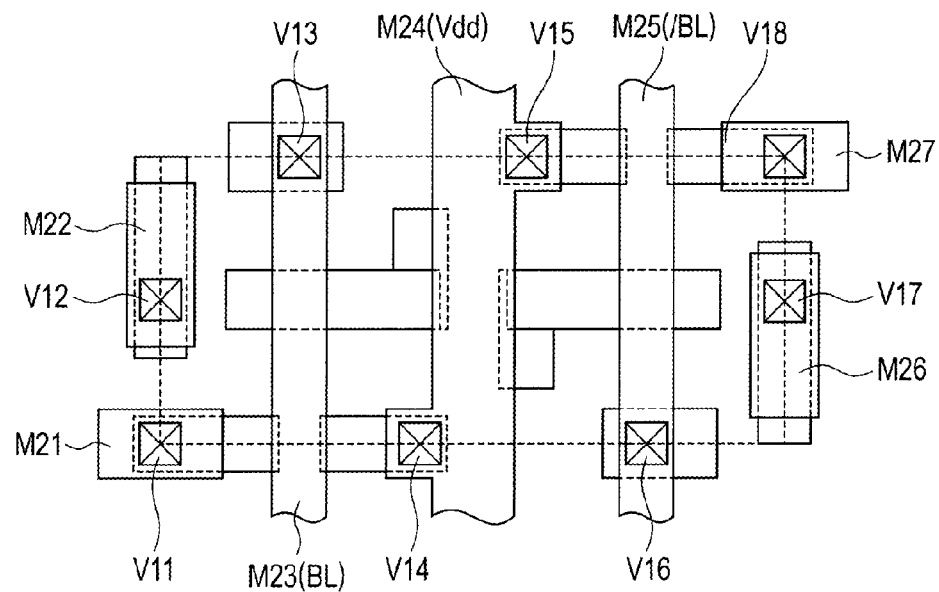
FIG. 18 shows how the first and second wirings are interconnected in the SRAM memory cell according to the comparative example.
Figure 19:
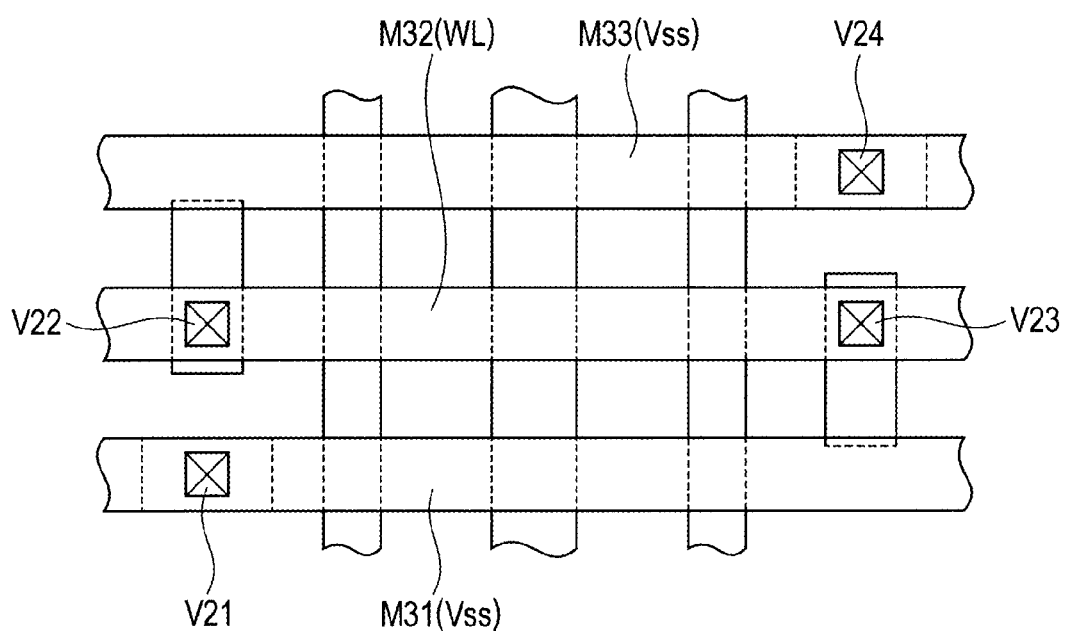
FIG. 19 shows how the second and third wirings are interconnected in the SRAN memory cell according to the comparative example.
Figure 20:
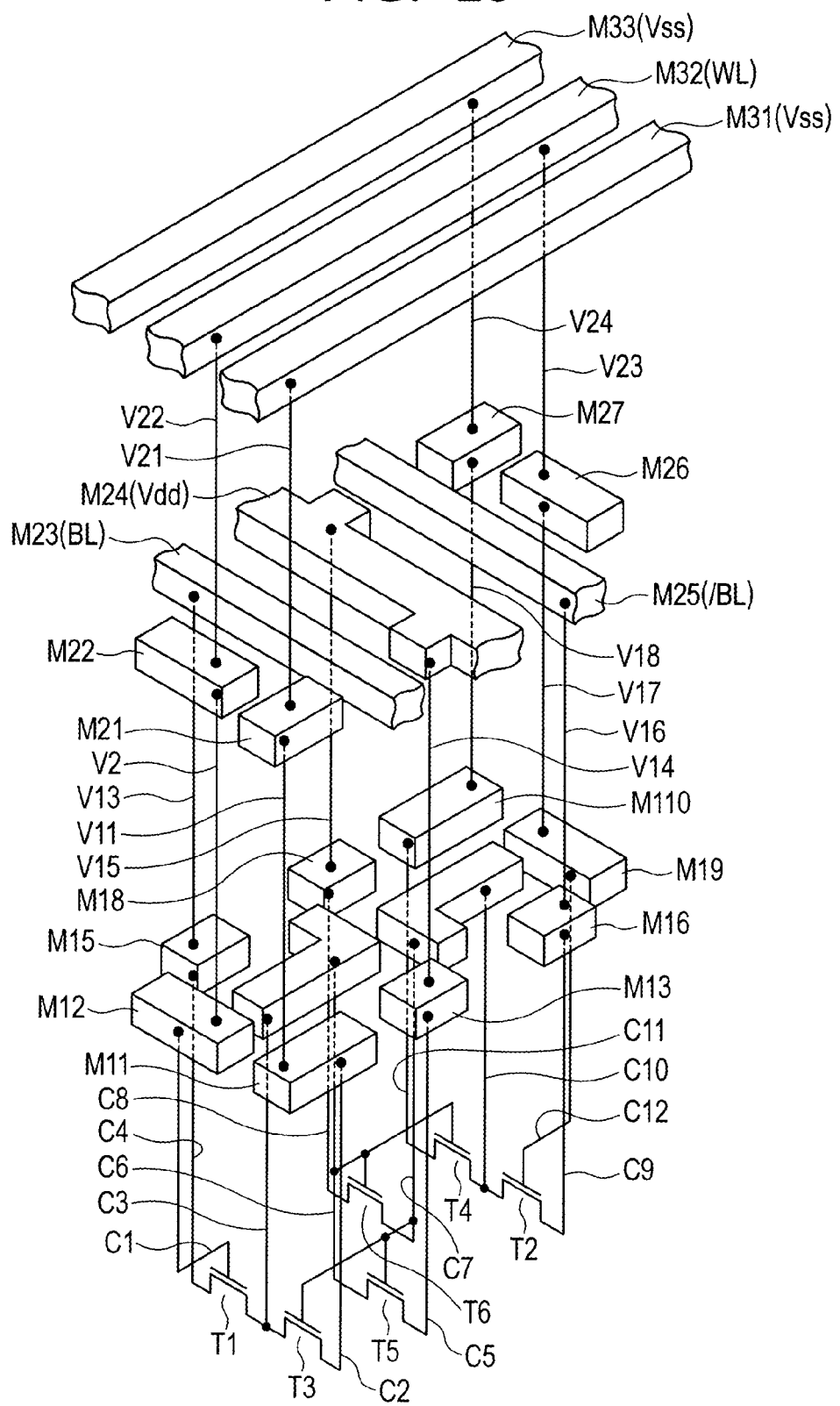
FIG. 20 is an exploded perspective view of the multilayer interconnection structure of the SRAM memory cell according to the comparative example.

FIG. 17 shows how the transistors and first wirings are interconnected in a memory cell of the semiconductor device according to the comparative example and FIG. 18 shows how the first and second wirings are interconnected. FIG. 19 shows how the second and third wirings are interconnected and FIG. 20 is an exploded perspective view of the whole multilayer interconnection structure.

As shown in FIGS. 17 to 20, in the semiconductor device according to the comparative example, a contact plug C1 to be electrically coupled to the access gate electrode AG1 (gate wiring part GHA1) of the access transistor T1 is formed and a first wiring M12 is electrically coupled to the contact plug C1. The first wiring M12 is electrically coupled to a second wiring M22 through a via V12.

Also a contact plug C12 to be electrically coupled to the access gate electrode AG2 (gate wiring part GHA2) of the access transistor T2 is formed and a first wiring M19 is electrically coupled to the contact plug C12. Then, the first wiring M19 is electrically coupled to a second wiring M26 through a via V23.

The other constituent elements are the same as those of the semiconductor device in the first embodiment, so the same elements are designated by the same reference numerals to avoid repeating the same descriptions. The same reference numerals as in the first embodiment are intended here to represent the elements which constitute the semiconductor device according to the comparative example.

As mentioned earlier, regarding the wirings formed in the SRAM memory cell region, the first wirings are more densely arranged than the second and third wirings. In the semiconductor device according to the comparative example, the contact plugs C1 to C10 which are coupled to prescribed parts of the access transistors T1 and T2, driver transistors T3 and T4, and load transistors T5 and T6 are all electrically coupled to prescribed vias V11 to V18 and prescribed second wirings M21 to M27 through prescribed first wirings M11 to M110 respectively.

For this reason, particularly when fabricating a photo-mask for patterning of a relatively short wiring as the first wiring M15 (M16) to be electrically coupled to the source or drain of the access transistor T1 (T2), optical proximity correction may be restricted by the relation with other first wirings adjacent to the first wirings M15 and M16, making it impossible to make optical proximity correction adequately.

When the photo-mask is incapable of making optical proximity correction adequately, a resist pattern (wiring trench pattern) for the design first wiring pattern cannot be made accurately and copper film or the like can not be properly filled in the wiring trench made using that resist pattern as a mask. As a consequence, in some cases the first wirings M15 and M16 cannot be formed as desired and the SRAM memory cell cannot function properly.

By contrast, in the semiconductor device (first example) according to this embodiment, the first wirings M12 and M19 in the comparative example (FIG. 20) as other first wirings adjacent to the first wirings M15 and M16 are not formed. Specifically, as shown in FIG. 5, the contact plug CPS1 (CPS2) electrically coupled to the gate wiring part GHA1 (GHA2) of the access transistor T1 (T2) is electrically coupled directly to the via VS1 (VS2) without intervention of the first wiring M12 (M19) (FIG. 20).

Due to the absence of the first wiring M12 (M19), as shown in FIG. 2, the length (W) of the first wiring M15 (M16) can be increased toward the side where the first wiring M15 (M16) is located Consequently, when fabricating a photo-mask for patterning of the first wirings including the first wiring M15 (M16), optical proximity correction for a photo-mask pattern for the first wirings M15 and M16 is less restricted than in the case of the related art semiconductor device and optical proximity correction can be made adequately.

When the photo-mask is thus designed for optical proximity correction, a resist pattern (wiring trench pattern) for the design pattern of the first wirings M15 and M16 can be formed with higher accuracy and copper film can be properly filled in the wiring trench made using the resist pattern as a mask. As a consequence, desired first wirings M15 and M16 which correspond to the design pattern can be formed with higher accuracy, so the SRAM memory cell can perform its function properly.

In addition, in the semiconductor device according to the first example, as shown in FIG. 2, the process margin in coupling the via VS1 (VS2) to the contact plug CPS1 (CPS2) can be increased by expanding the area of the contact plug CPS1 (CPS2) to be in direct contact with the via VS1 (VS2), in a direction nearly perpendicular to the direction in which the gate wiring part GHA1 (GHA2) of the access transistor T1 (T2) extends.

Furthermore, while in the case of the semiconductor device according to the comparative example, the photo-mask for first wirings must be updated by optical proximity correction at each generation change, in the case of the semiconductor device according to the first example, there is no need for optical proximity correction for each new generation because the first wiring M12 (M19) is not formed and the design pattern for the first wiring M15 (M16) can be expanded. Consequently the time required to develop a new model can be shortened and cost reduction can be achieved

SECOND EXAMPLE

The first example has been so far described with focus on the first wiring M15 (M16) as a relatively short first wiring, in which the first wiring M12 (M19) adjacent to the first wiring M15 (M16) is not formed. Next, the second example will be described with focus on the first wiring M13 (M18) as a relatively short first wiring, in which the first wiring M11 (M110) (FIG. 20) adjacent to the first wiring M13 (M18) is not formed.

Figure 21:
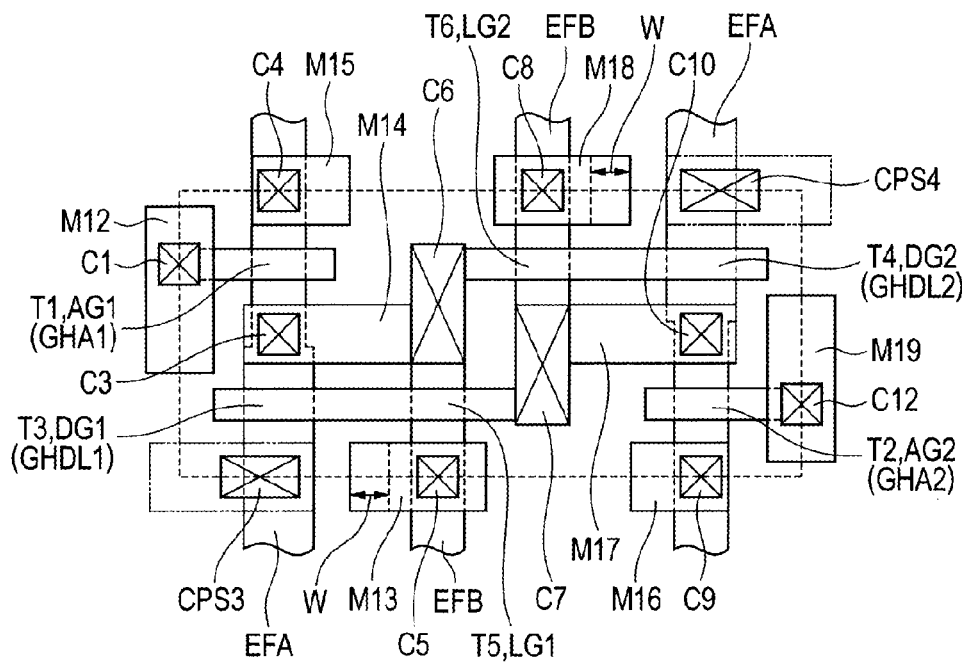
FIG. 21 is a plan view showing how the transistors and first wirings are interconnected in an SRAM memory cell of a semiconductor device according to a second example of the first embodiment of the present invention.
Figure 22:
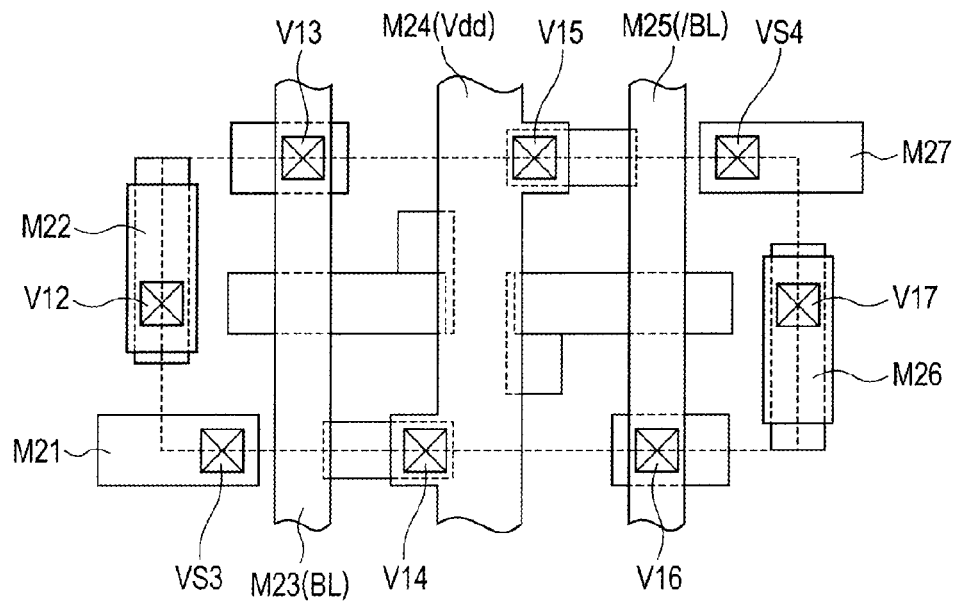
FIG. 22 is a plan view showing how the first and second wirings are interconnected in the second example of the first embodiment.
Figure 23:
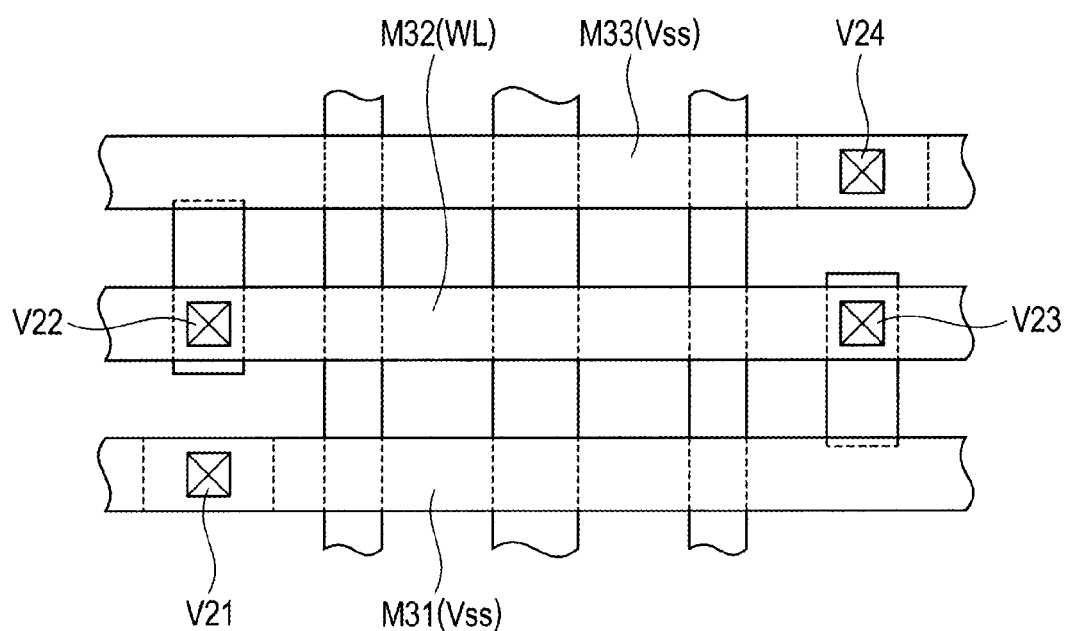
FIG. 23 is a plan view showing how the second and third wirings are interconnected in the second example of the first embodiment.
Figure 24:
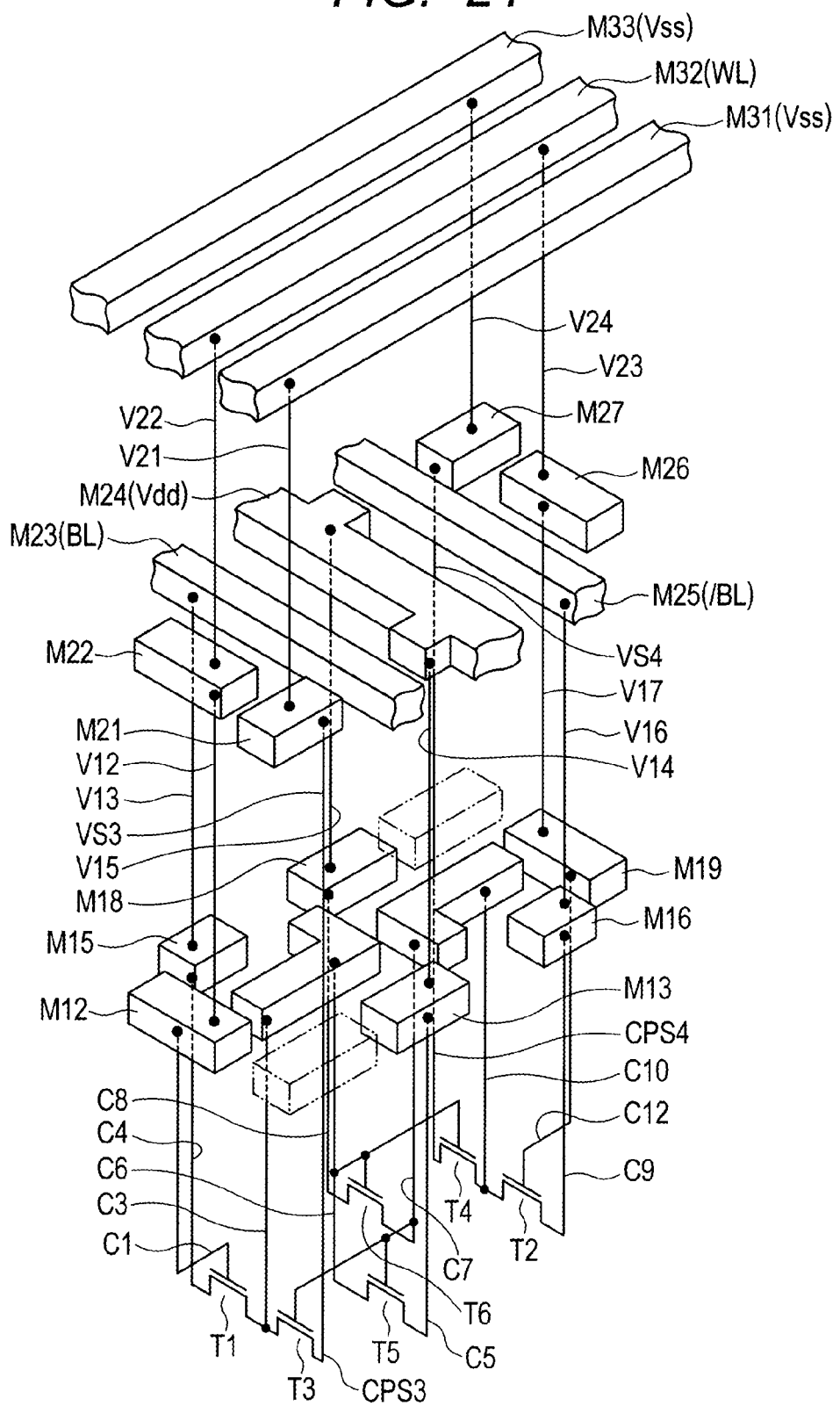
FIG. 24 is an exploded perspective view of the multilayer interconnection structure of the SRAM memory cell in the second example of the first embodiment.

FIG. 21 shows how the transistors and first wirings are interconnected in a memory cell of the semiconductor device according to the second example and FIG. 22 shows how the first and second wirings are interconnected in the second example. FIG. 23 shows how the second and third wirings are interconnected and FIG. 24 is an exploded perspective view of the whole multilayer interconnection structure.

As shown in FIGS. 21 to 24, in an SRAM memory cell of this semiconductor device, among the contact plugs coupled to a driver transistor T3, a contact plug CPS3 to be coupled to a grounding wiring is directly coupled to a via VS3. The via VS3 is electrically coupled to a third wiring M31 as a grounding wiring through a second wiring M21 and a via V21.

Also, among the contact plugs coupled to a driver transistor T4, a contact plug CPS4 to be coupled to a grounding wiring is directly coupled to a via VS4. The via VS4 is electrically coupled to a third wiring M33 as a grounding wiring through a second wiring M27 and a via V24.

In other words, in this SRAM memory cell, the first wirings for electrically coupling the driver transistors and grounding wirings, among the first wirings which are formed in the SRAM memory cell according to the comparative example, are not formed.

On the other hand, a contact plug C1 electrically coupled to the gate wiring part GHA1 of the access transistor T1 is coupled through a first wiring M12 to a via V12 to be electrically coupled to the third wiring M32 as a word line. Also, a contact plug C12 electrically coupled to the gate wiring part GHA2 of the access transistor T2 is coupled through a first wiring M19 to a via V17 to be electrically coupled to the third wiring M32 as the word line. The other constituent elements are the same as those of the semiconductor device shown in FIGS. 2 to 5, so the same elements are designated by the same reference numerals and descriptions thereof are not repeated.

The method for manufacturing a semiconductor device according to the second example is basically the same as that for the semiconductor device according to the first example except that the photo-mask pattern for the first wirings must be modified.

For the semiconductor device according to the second example, desired first wirings which correspond to a design pattern can be formed, which will be explained next. In the semiconductor device according to the comparative example, the first wirings which are relatively short include not only the first wirings M15 and M16 but also the first wirings M13 and M18. The first wiring M13 (M18) is electrically coupled to the source or drain of a load transistor T5 (T6).

Due to the absence of the first wiring M11 (M110) adjacent to the first wiring M13 (M18), as shown in FIG. 21, the length (W) of the first wiring M13 (M18) can be increased toward the side where the first wiring M11 (M110) is located. Consequently, as explained above in connection with the semiconductor device according to the first example, when fabricating a photo-mask for patterning of the first wirings including the first wiring M13 (M18), optical proximity correction for a photo-mask pattern for the first wirings M13 and M18 is less restricted than in the case of the related art semiconductor device and optical proximity correction can be made adequately.

When the photo-mask is thus designed for optical proximity correction, a resist pattern (wiring trench pattern) for the design pattern of the first wirings M13 and M18 can be formed with higher accuracy and copper film can be properly filled in the wiring trench made using the resist pattern as a mask. As a consequence, desired first wirings M13 and M18 which correspond to the design pattern can be formed with higher accuracy, so the SRAM memory cell can perform its function properly.

In addition, in the semiconductor device according to the second example, as shown in FIG. 21, the process margin in coupling the via VS3 (VS4) to the contact plug CPS3 (CPS4) can be increased by expanding the area of the contact plug CPS3 (CPS4) to be in direct contact with the via VS3 (VS4), in the direction in which the gate wiring part GHDL1 (GHDL2) of the driver transistor T3 (T4) extends.

Furthermore, since the first wiring M11 (M110) is not formed and the first wiring M13 (M18) can be expanded, there is no need to update the optical proximity correction for each new generation of first wiring photo-mask pattern. Consequently the time required to develop a new model can be shortened and cost reduction can be achieved.

THIRD EXAMPLE

As the third example, a semiconductor device which combines the semiconductor device according to the first example and the semiconductor device according to the second example will be described.

Figure 25:
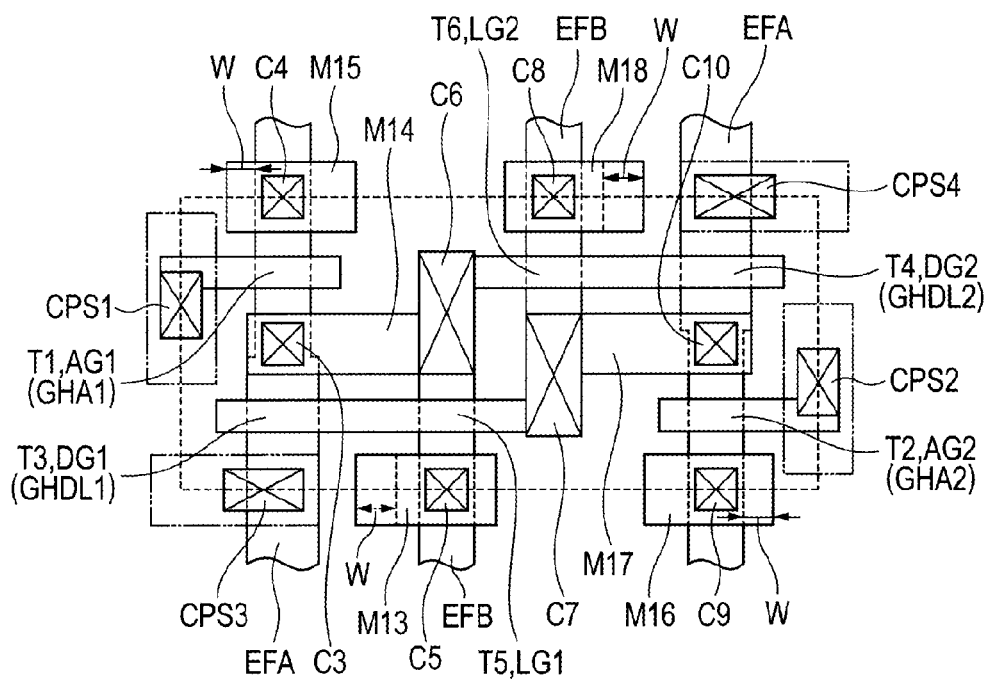
FIG. 25 is a plan view showing how the transistors and first wirings are interconnected in an SRAM memory cell of a semiconductor device according to a third example of the first embodiment of the present invention.
Figure 26:
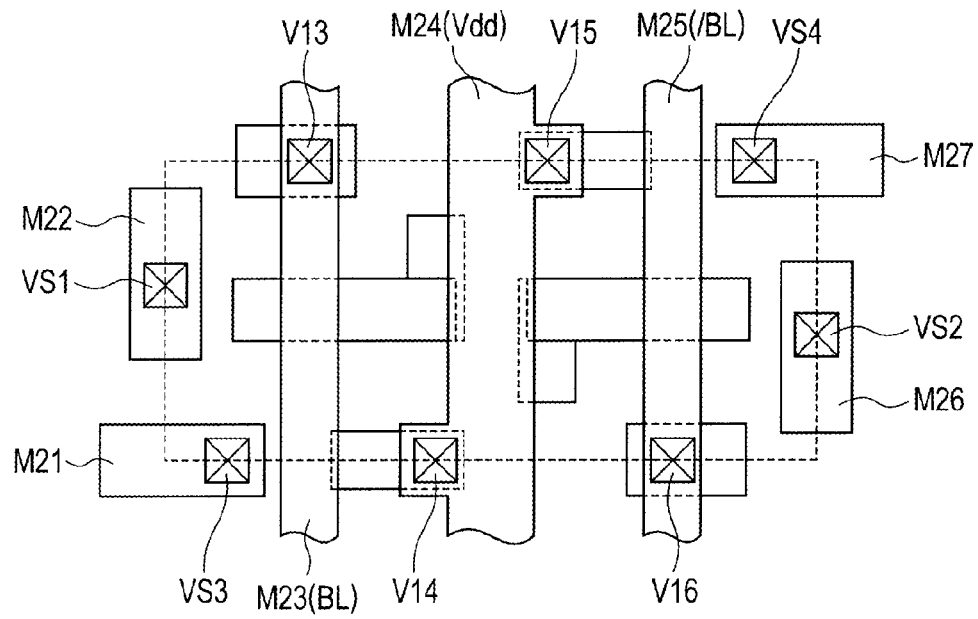
FIG. 26 is a plan view showing how the first and second wirings are interconnected in the third example of the first embodiment.
Figure 27:
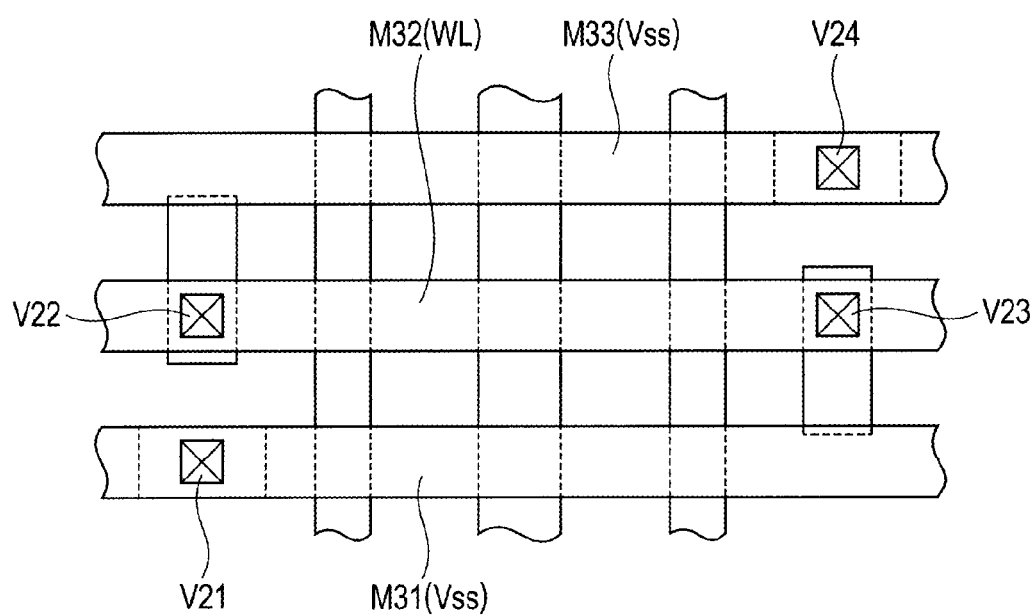
FIG. 27 is a plan view showing how the second and third wirings are interconnected in the third example of the first embodiment.
Figure 28:
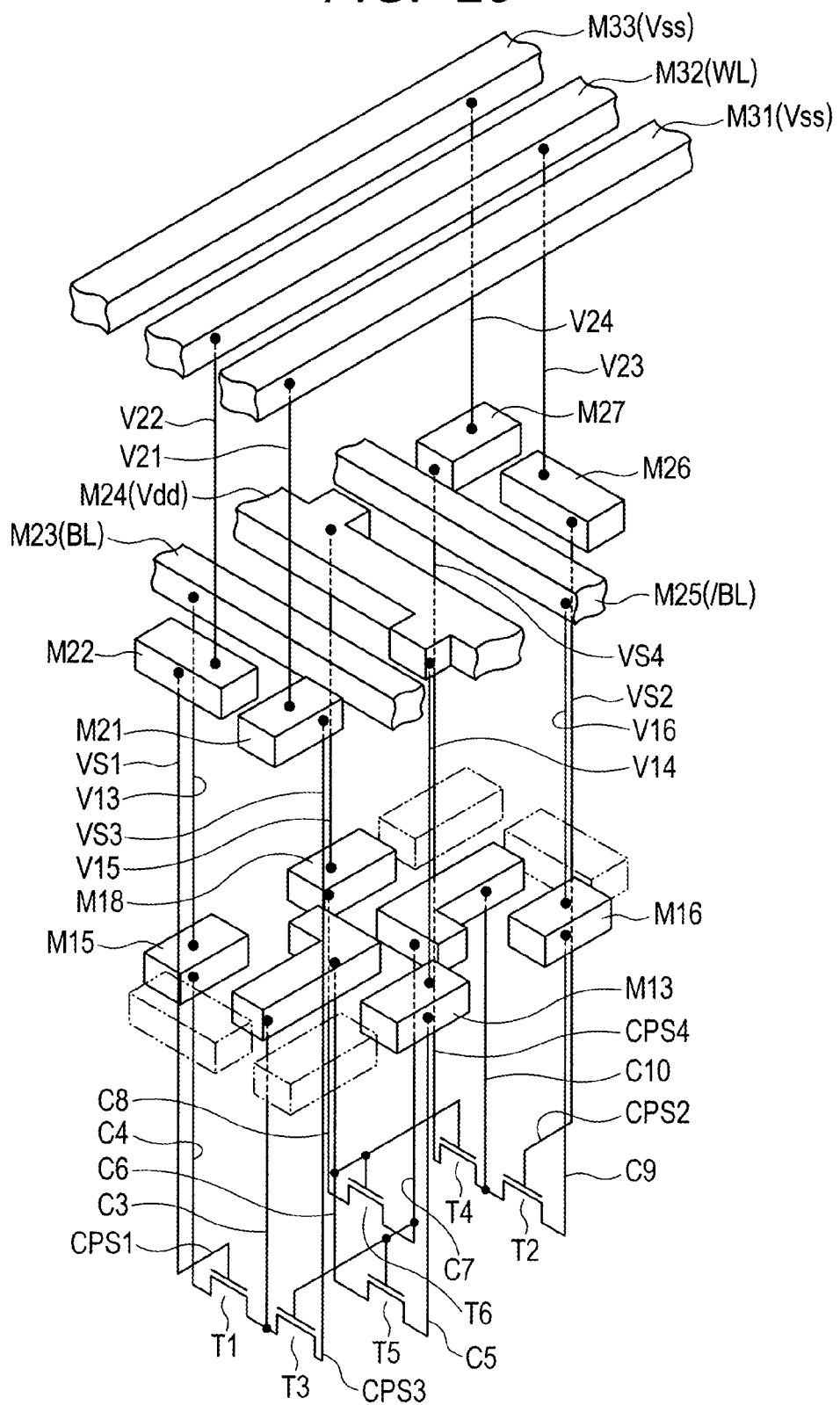
FIG. 28 is an exploded perspective view of the multilayer interconnection structure of the SRAM memory cell in the third example of the first embodiment.

FIG. 25 shows how the transistors and first wirings are interconnected in a memory cell of the semiconductor device according to the third example and FIG. 26 shows how the first and second wirings are interconnected in the third example. FIG. 27 shows how the second and third wirings are interconnected and FIG. 28 is an exploded perspective view of the whole multilayer interconnection structure.

As shown in FIGS. 25 to 28, in the semiconductor device according to the third example, the first wirings M12 (M19) and M11 (M110) (FIG. 20) which are formed in the semiconductor device according to the comparative example are not formed and the via VS1 is directly coupled to the contact plug CPS1 (CPS2) and the via VS3 is directly coupled to the contact plug CPS3. The other constituent elements are the same as those of the semiconductor device shown in FIGS. 2 to 5, so the same elements are designated by the same reference numerals and descriptions thereof are not repeated.

The method for manufacturing a semiconductor device according to the third example is basically the same as that for the semiconductor device according to the first example except that the photo-mask pattern for the first wirings must be modified.

In the semiconductor device according to the third example, as explained above in connection with the first and second examples, because the design pattern for the first wiring M15 (M16) can be expanded due to the absence of the first wiring M12 (M19) and the design pattern for the first wiring M13 (M18) can be expanded due to the absence of the first wiring M11 (M110). As a consequence, desired first wirings M15, M16, M13, and M18 which correspond to the design pattern can be formed with higher accuracy, so the SRAM memory cell can perform its function properly.

Also, as explained above in connection with the first and second examples, the process margin in coupling the via VS1 (VS2) to the contact plug CPS1 (CPS2) can be increased and the process margin in coupling the via VS3 (VS4) to the contact plug CPS3 (CPS4) can be increased. Furthermore, there is no need to update the optical proximity correction for each new generation of first wiring photo-mask pattern. Consequently the time required to develop a new model can be shortened and cost reduction can be achieved.

Second Embodiment

Next, an explanation will be given of four variations (first to fourth examples) of the semiconductor device in which among the first wirings of an SRAM memory cell, relatively short first wirings are eliminated and vias corresponding to them are directly coupled to contact plugs.

FIRST EXAMPLE

Figure 29:
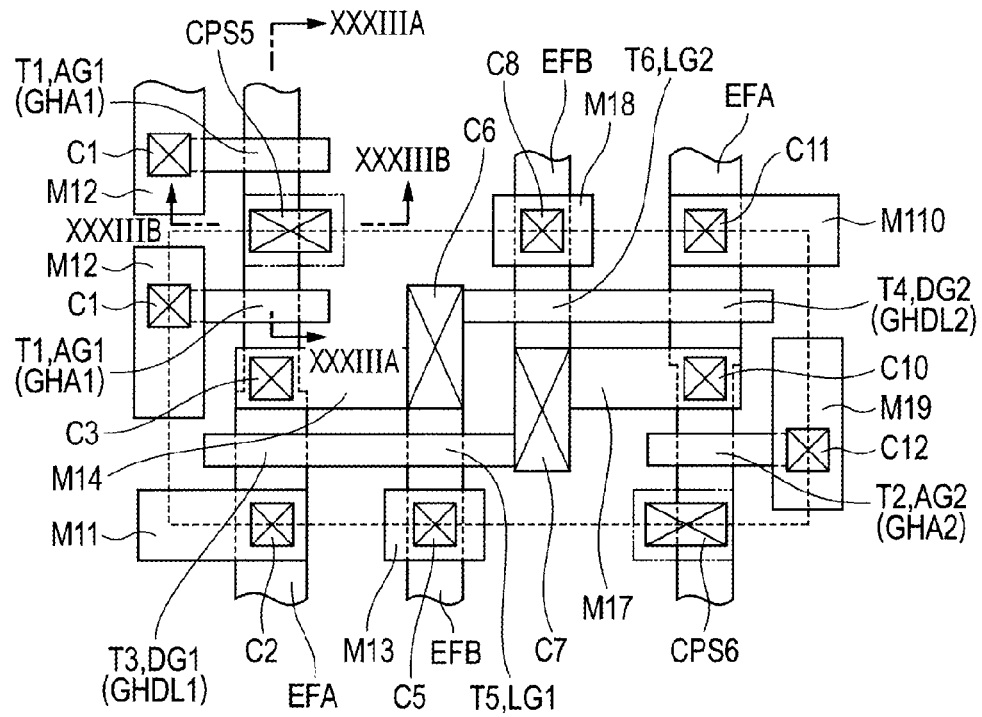
FIG. 29 is a plan view showing how the transistors and first wirings are interconnected in an SRAM memory cell of a semiconductor device according to a first example of a second embodiment of the present invention.
Figure 30:
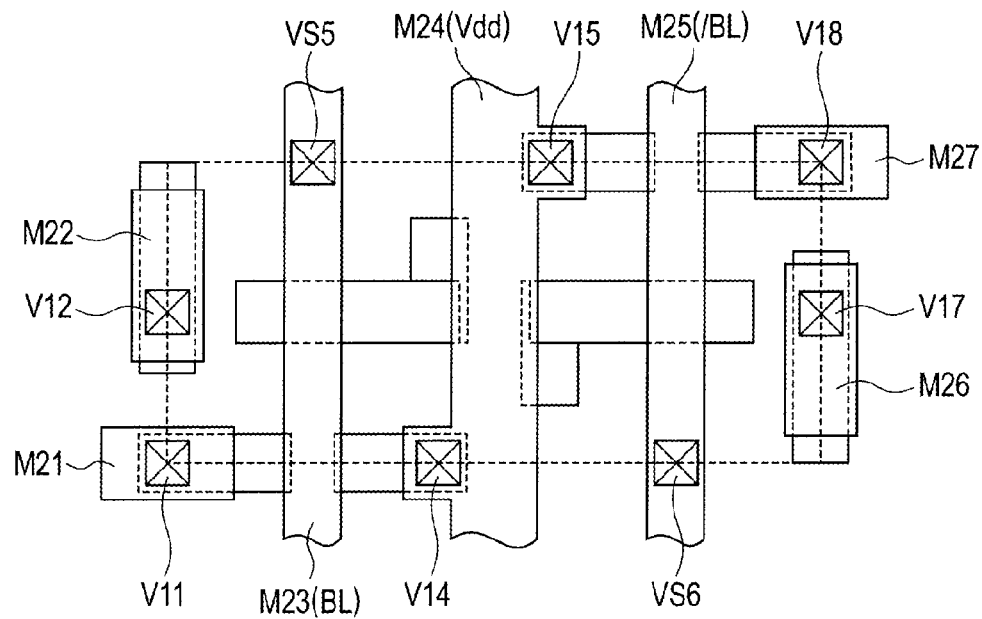
FIG. 30 is a plan view showing how the first and second wirings are interconnected in the first example of the second embodiment.
Figure 31:
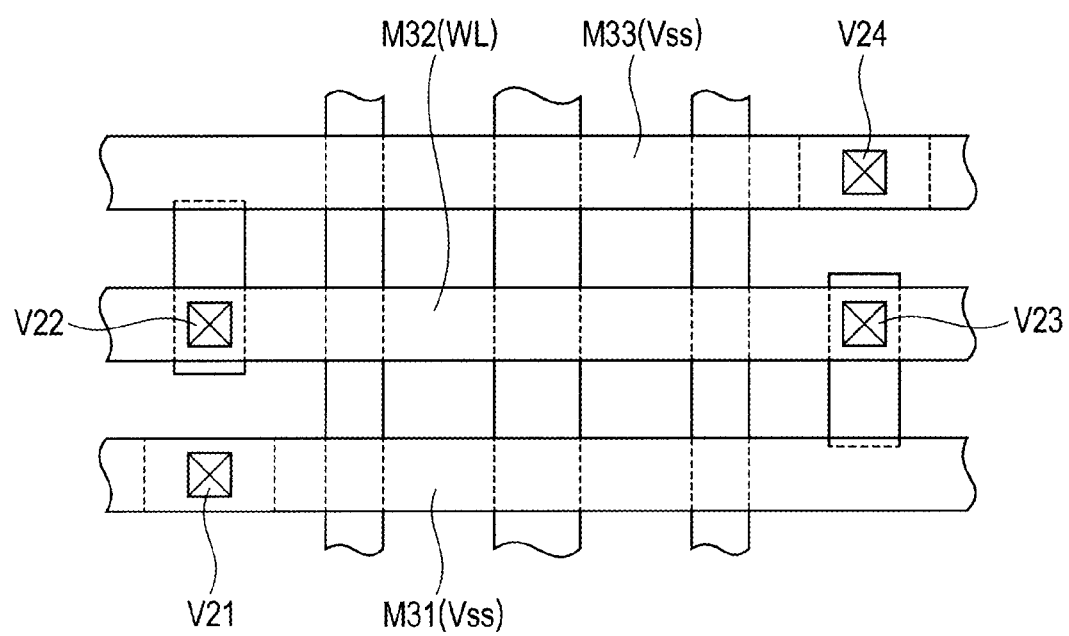
FIG. 31 is a plan view showing how the second and third wirings are interconnected in the first example of the second embodiment.
Figure 32:
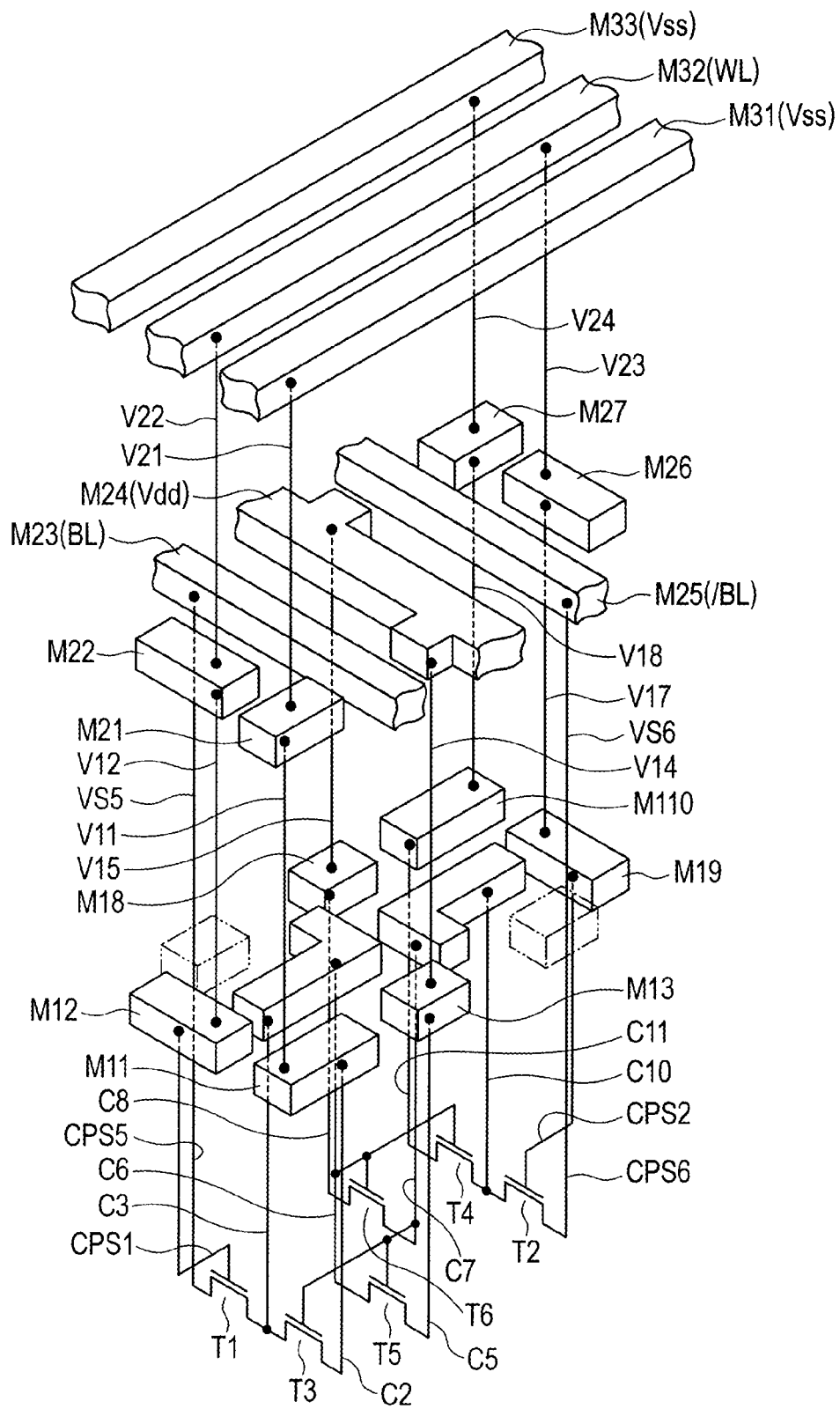
FIG. 32 is an exploded perspective view of the multilayer interconnection structure of the SRAM memory cell in the first example of the second embodiment.

FIG. 29 shows how the transistors and first wirings are interconnected in the semiconductor device according to the first example and FIG. 30 shows how the first and second wirings are interconnected. FIG. 31 shows how the second and third wirings are interconnected and FIG. 32 is an exploded perspective view of the whole multilayer interconnection structure.

As shown in FIGS. 29 to 32, among the contact plugs coupled to an access transistor T1, a contact plug CPS5 to be coupled to a bit line is directly coupled to a via VS5. The via VS5 is electrically coupled to a second wiring M23 as a bit line BL.

Among the contact plugs coupled to an access transistor T2, a contact plug CPS6 to be coupled to a bit line is directly coupled to a via VS6. The via VS6 is electrically coupled to a second wiring M25 as a bit line /BL. The other constituent elements which are the same as in the semiconductor device according to the first example or the semiconductor device according to the second example are designated by the same reference numerals and descriptions thereof are not repeated.

Figure 33:
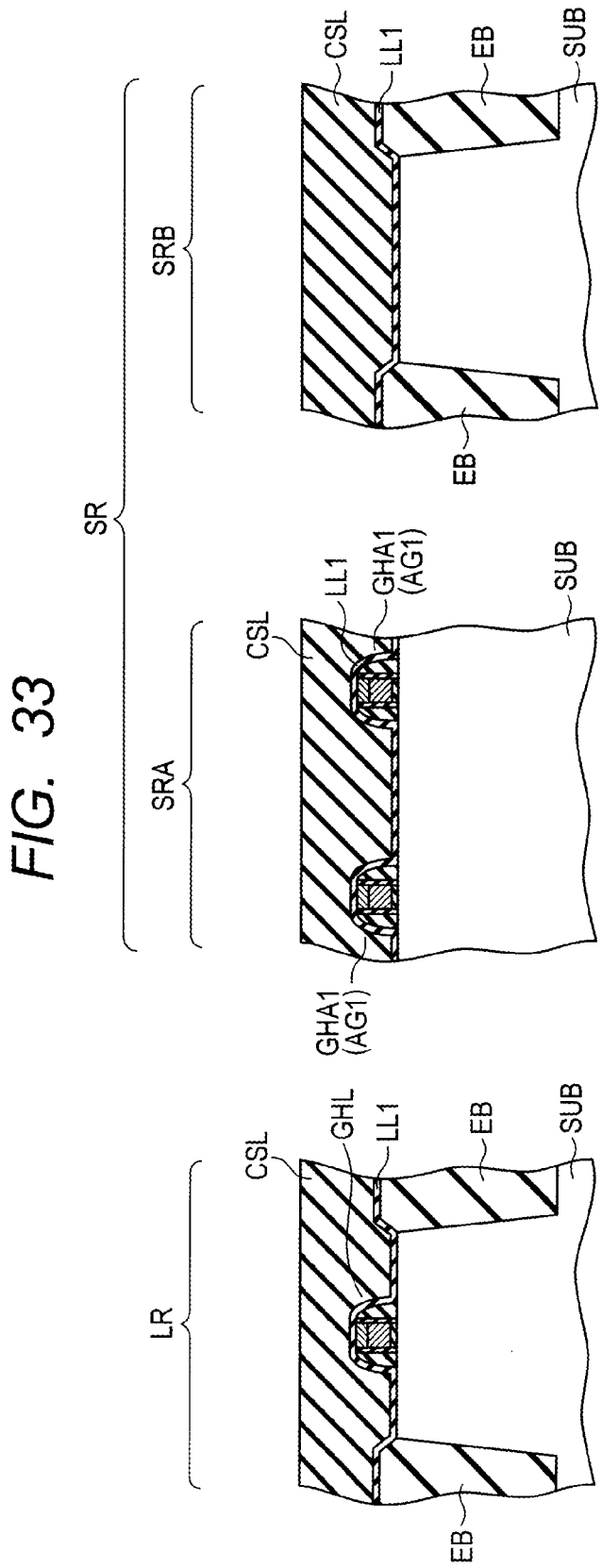
FIG. 33 is a sectional view showing a step in the method for manufacturing a semiconductor device in the second embodiment including a cross section taken along the line XXXIIIA-XXXIIIA of FIG. 29 and a cross section taken along the line XXXIIIB-XXXIIIB of FIG. 29.

Next, an example of the method for manufacturing the above semiconductor device will be described. As shown in FIG. 33, an element isolation insulating film EB is formed in a given region of a semiconductor substrate SUB. Then, prescribed gate wiring parts GHA1, GHA2, GHDL1, and GHDL2 (FIG. 29) are formed in a way to cross the element formation regions EFA and EFB (FIG. 29) as defined by the element isolation insulating film EB.

On the other hand, the gate wiring part GHL of a transistor as a constituent of the logic circuit is formed in the logic circuit region LR in which the logic circuit is formed. Then, a liner film LL1 such as a silicon nitride film is formed in a way to cover the gate wiring part GHA1, etc and gate wiring part GHL. Then, a contact interlayer insulating film CSL, for example, as a TEOS film or HDP film is formed in a way to cover the liner film LL1.

Figure 34:
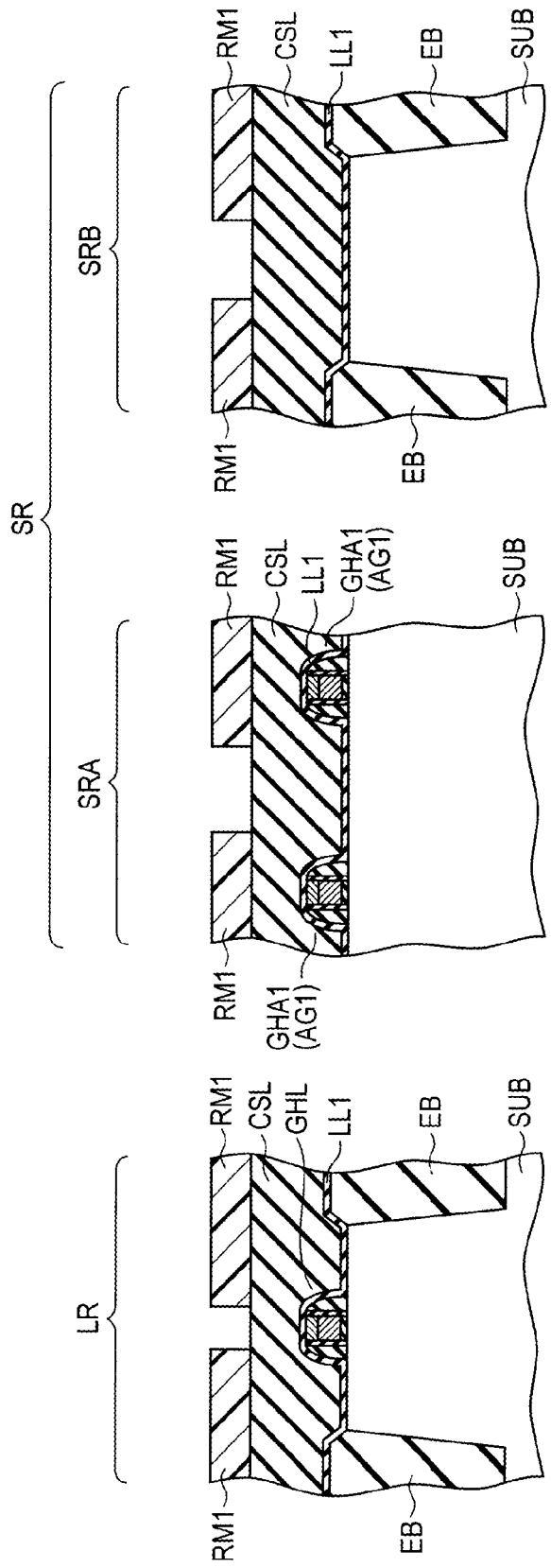
FIG. 34 is a sectional view showing a step to be taken after the step shown in FIG. 33 in the second embodiment.
Figure 35:
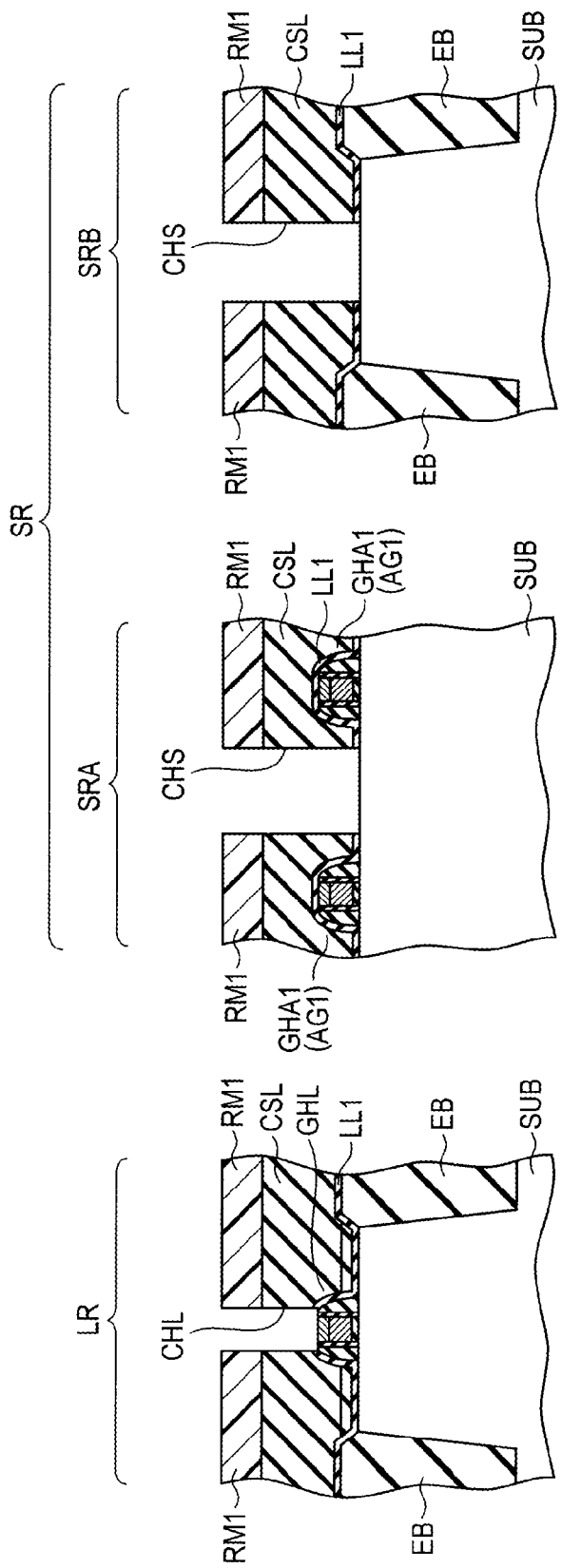
FIG. 35 is a sectional view showing a step to be taken after the step shown in FIG. 34 in the second embodiment.

Next, as shown in FIG. 34, a photoresist film RM1 for contact holes is formed by a given photoengraving process. Then, as shown in FIG. 35, a contact hole CHS which exposes the element formation region (active region) is made by etching the contact interlayer insulating film CSL using the photoresist film RM1 as a mask. On the other hand, a contact hole CHL which exposes the gate wiring part GHL is made in the logic circuit region LR. After that, the photoresist film RM1 is removed.

Figure 36:
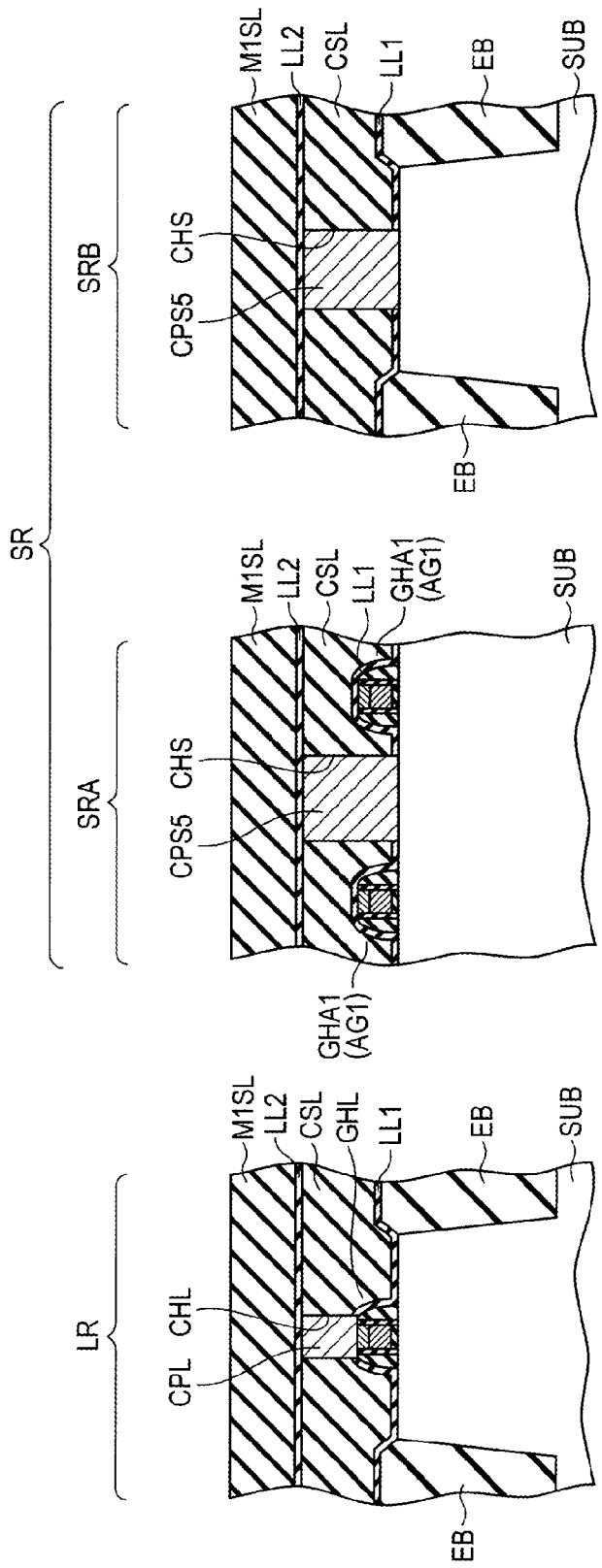
FIG. 36 is a sectional view showing a step to be taken after the step shown in FIG. 35 in the second embodiment.

Next, as shown in FIG. 36, in the memory cell region SR, a contact plug CPS5, for example, as a tungsten film or the like is formed in the contact hole CHS. In the logic circuit region LR, a contact plug CPL is formed in the contact hole CHL. Then, a liner film LL2 such as a silicon nitride film is formed in a way to cover the contact plugs CPS5 and CPL. Then, an M1 interlayer insulating film M1SL, for example, as a low-k film is formed in a way to cover the liner film LL2.

Figure 37:
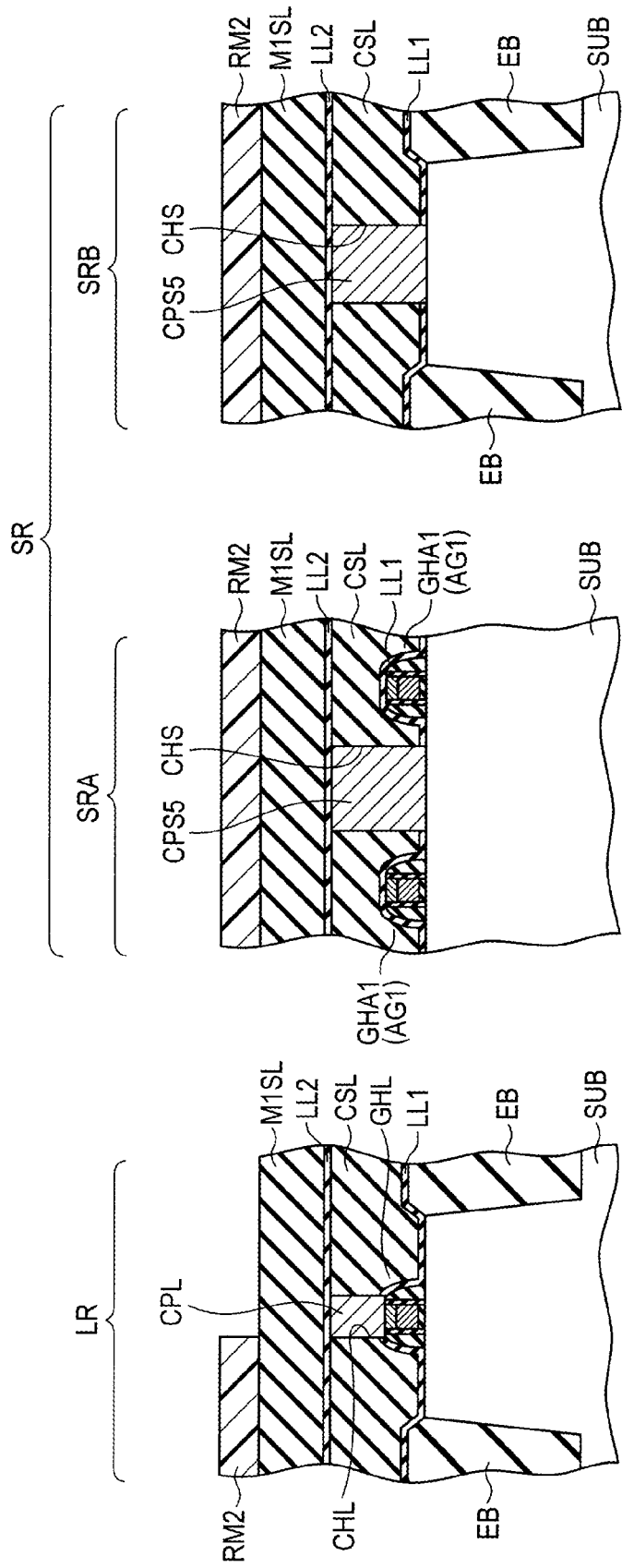
FIG. 37 is a sectional view showing a step to be taken after the step shown in FIG. 36 in the second embodiment.

Next, as shown in FIG. 37, a photoresist film RM2 for the formation of a wiring trench for first wirings is formed. Here, since the first wiring to be coupled to the contact plug CPS5 (CPS6) is not formed, the photoresist film RM2 is formed in a way to cover the part of the M1 interlayer insulating film M1SL lying just above the contact plug CPS5 (CPS6). Then, a wiring trench HTL1 (FIG. 38), etc. is formed by etching the M1 interlayer insulating film M1SL using the photoresist film RM2 as a mask. Then, the photoresist film RM2 is removed.

Figure 38:
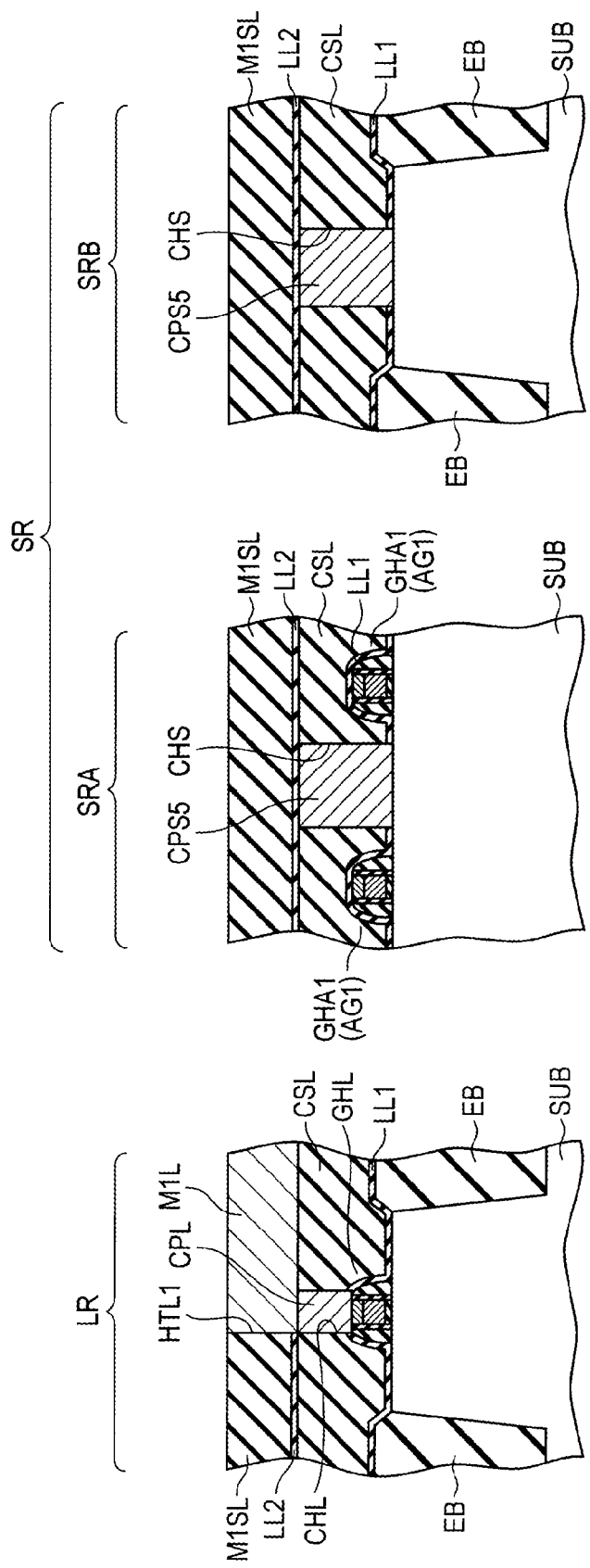
FIG. 38 is a sectional view showing a step to be taken after the step shown in FIG. 37 in the second embodiment.
Figure 39:
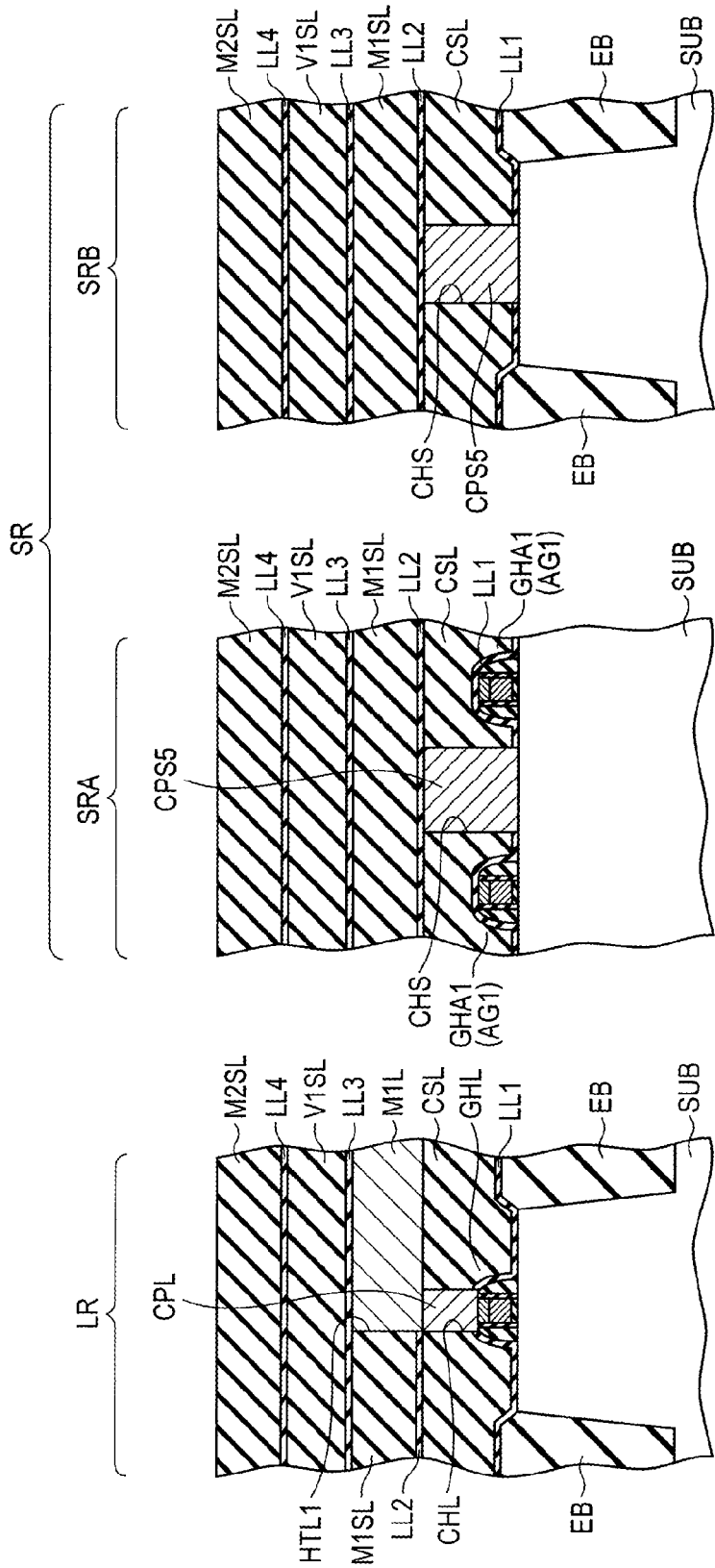
FIG. 39 is a sectional view showing a step to be taken after the step shown in FIG. 38 in the second embodiment.

Next, a copper film is formed by plating or another technique so as to fill the wiring trench HTL1, etc. Then, as shown in FIG. 38, a wiring M1L, etc. is formed inside the wiring trench HTL1 by chemical mechanical polishing of the copper film. Then, as shown in FIG. 39, a liner film LL3 such as a silicon nitride film is formed over the M1 interlayer insulating film M1SL in a way to cover the wiring M1L, etc. Then, a V1 interlayer insulating film V1SL as a low-k film is formed in a way to cover the liner film LL3. Then, a liner film LL4 such as a silicon nitride film is formed in a way to cover the V1 interlayer insulating film V1SL. Then, an M2 interlayer insulating film M2SL as a low-k film is formed in a way to cover the liner film LL4.

Figure 40:
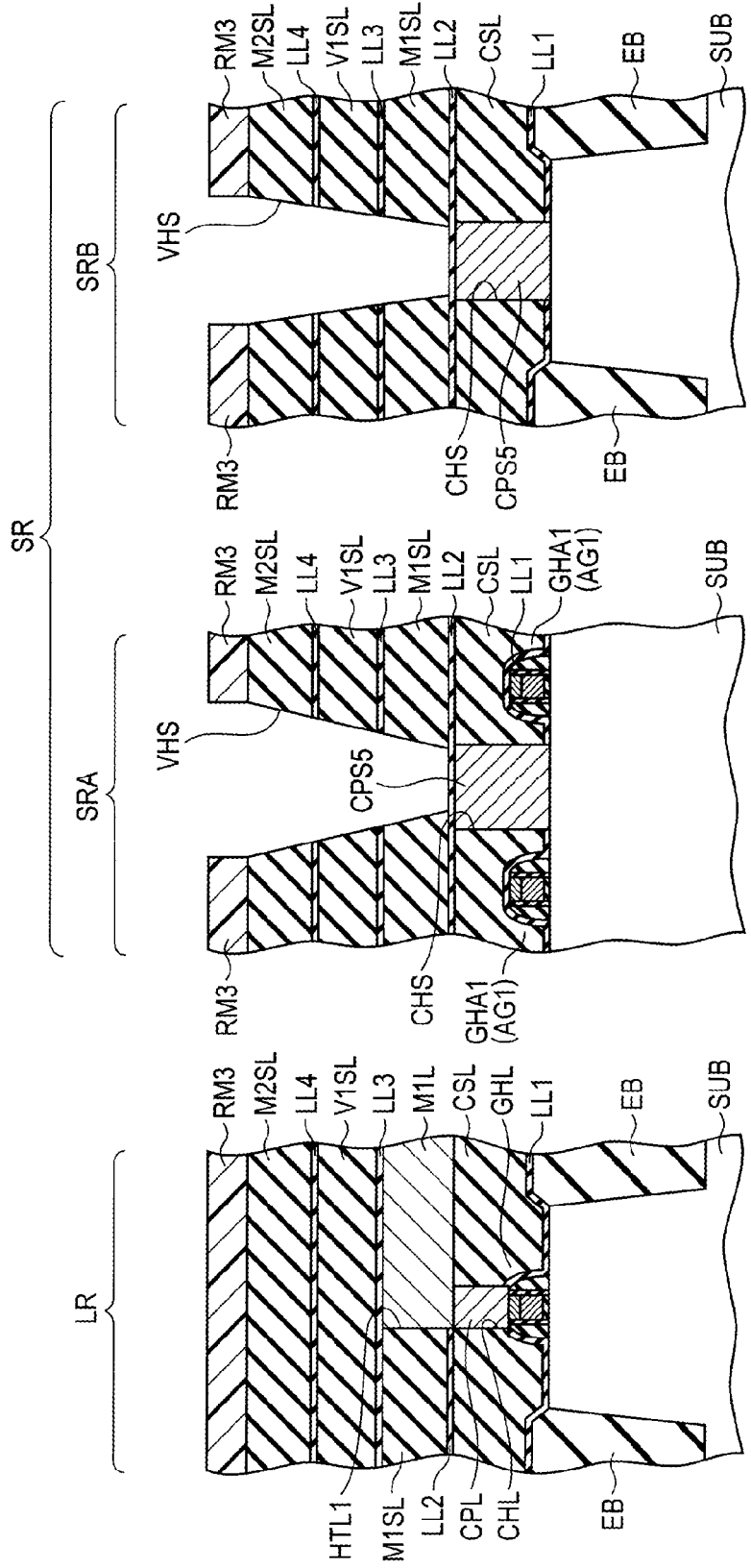
FIG. 40 is a sectional view showing a step to be taken after the step shown in FIG. 39 in the second embodiment.

Next, as shown in FIG. 40, a photoresist film RM3 is formed for the formation of a via to be coupled to the contact plug CPS5 (CPS6). Then, a via hole VHS which exposes the liner film LL2 is formed by etching the M2 interlayer insulating film M2SL, etc. using the photoresist film RM3 as a mask. Then, the photoresist film RM3 is removed.

Figure 41:
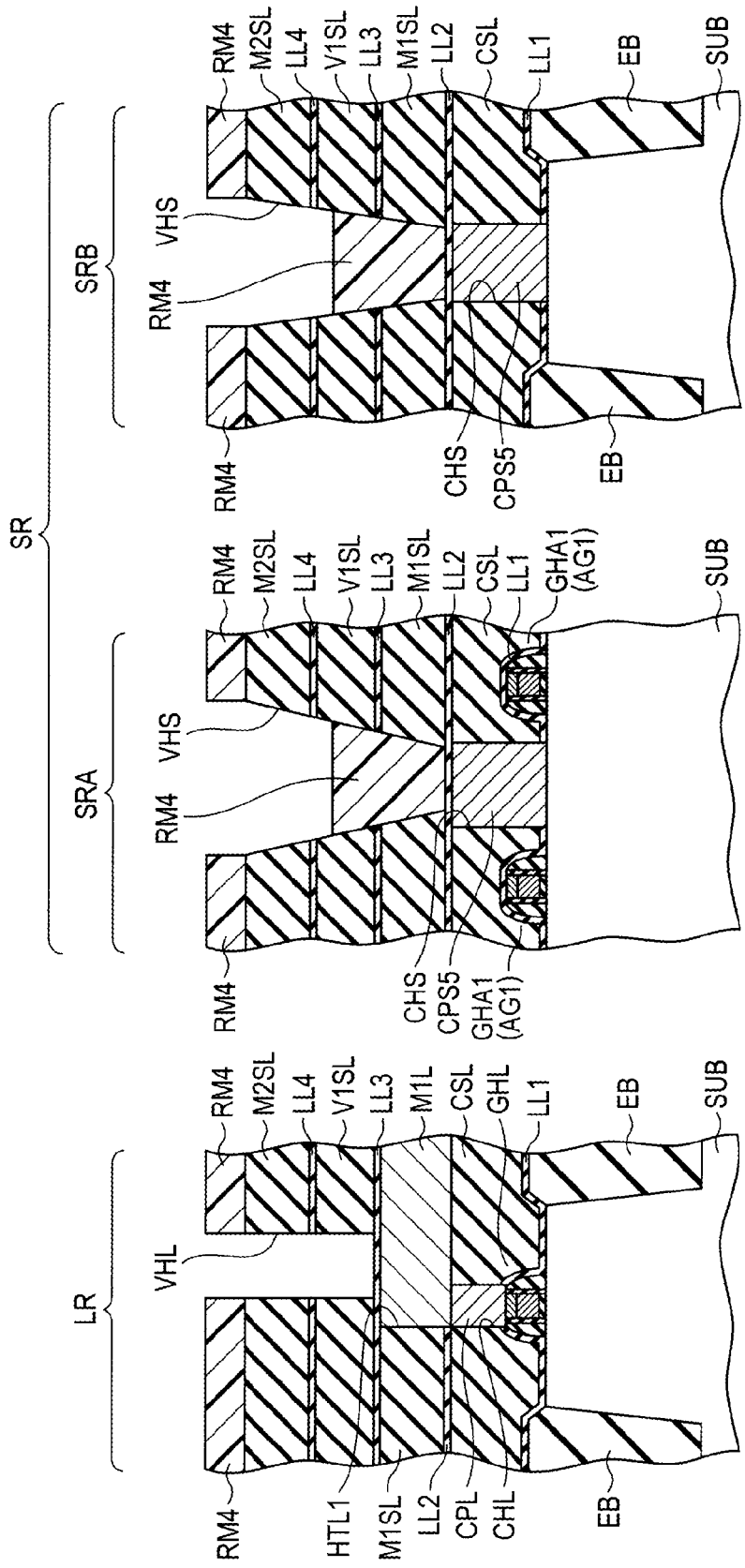
FIG. 41 is a sectional view showing a step to be taken after the step shown in FIG. 40 in the second embodiment.

Next, as shown in FIG. 41, a photoresist film RM4 is formed for the formation of a via to be coupled to a first wiring. Here, part of the photoresist film RM4 is filled in the previously formed via hole VHS and it functions as a protective film. Then, a via hole VHL which exposes the liner film LL3 is formed in the logic circuit region LR by etching the M2 interlayer insulating film M2SL, etc. using the photoresist film RM4 as a mask.

At this time, a via hole (not shown) which exposes the part of the liner film LL3 lying just above the first wiring (not shown) is formed in the memory cell region MR. Part of the photoresist film RM4 is filled in the via hole VHS, which prevents damage to the bottom or similar part of the via hole VHS during etching for the formation of the via hole VHL.

Figure 42:
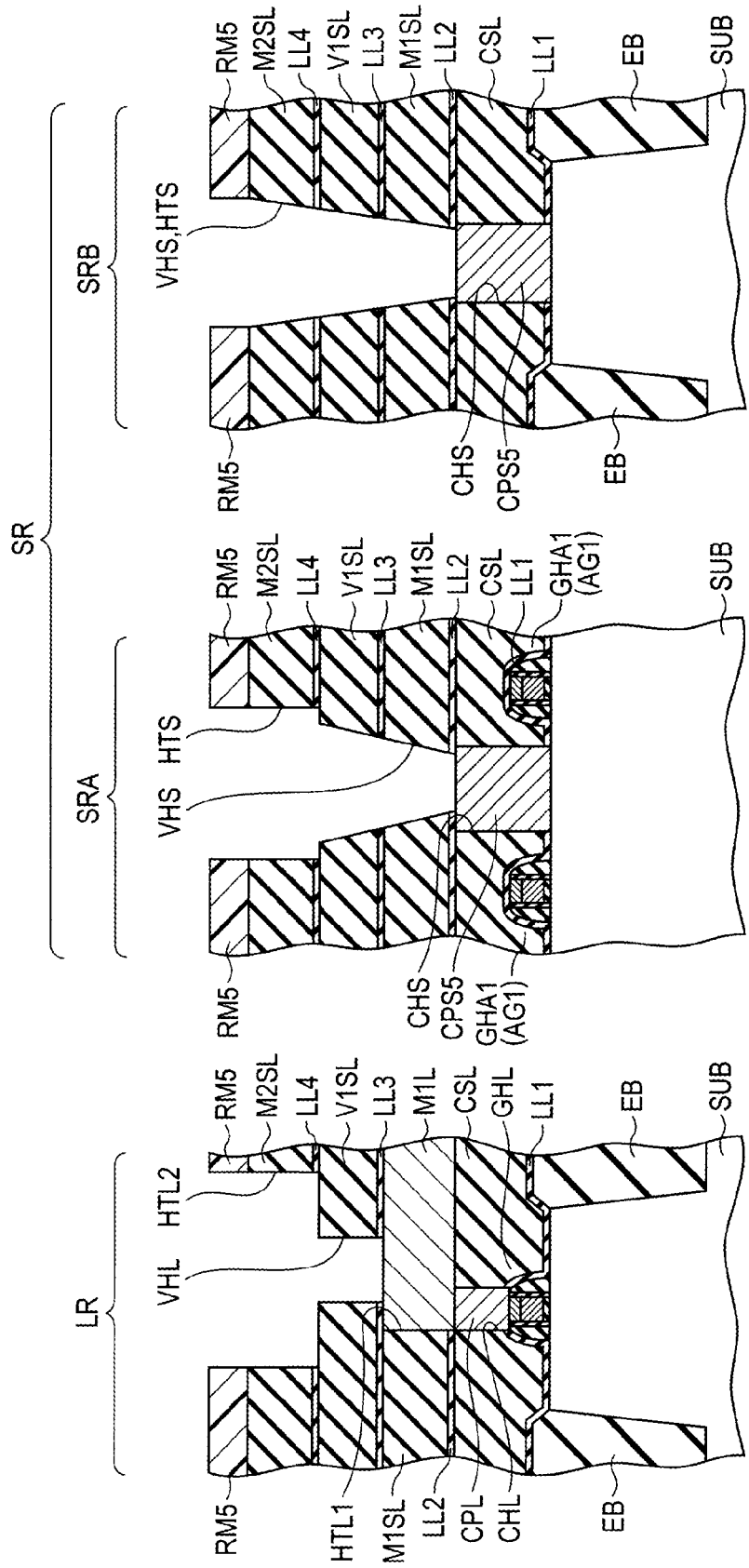
FIG. 42 is a sectional view showing a step to be taken after the step shown in FIG. 40 in the second embodiment.

Next, as shown in FIG. 42, a photoresist film RM5 is formed for the formation of a wiring trench for second wirings. Then, a wiring trench HTS is formed in the memory cell region SR by etching the M2 interlayer insulating film M2SL using the photoresist film RM5 as a mask. A wiring trench HTL2 is formed in the logic circuit region LR. Then, the photoresist film RM5 is removed.

Figure 43:
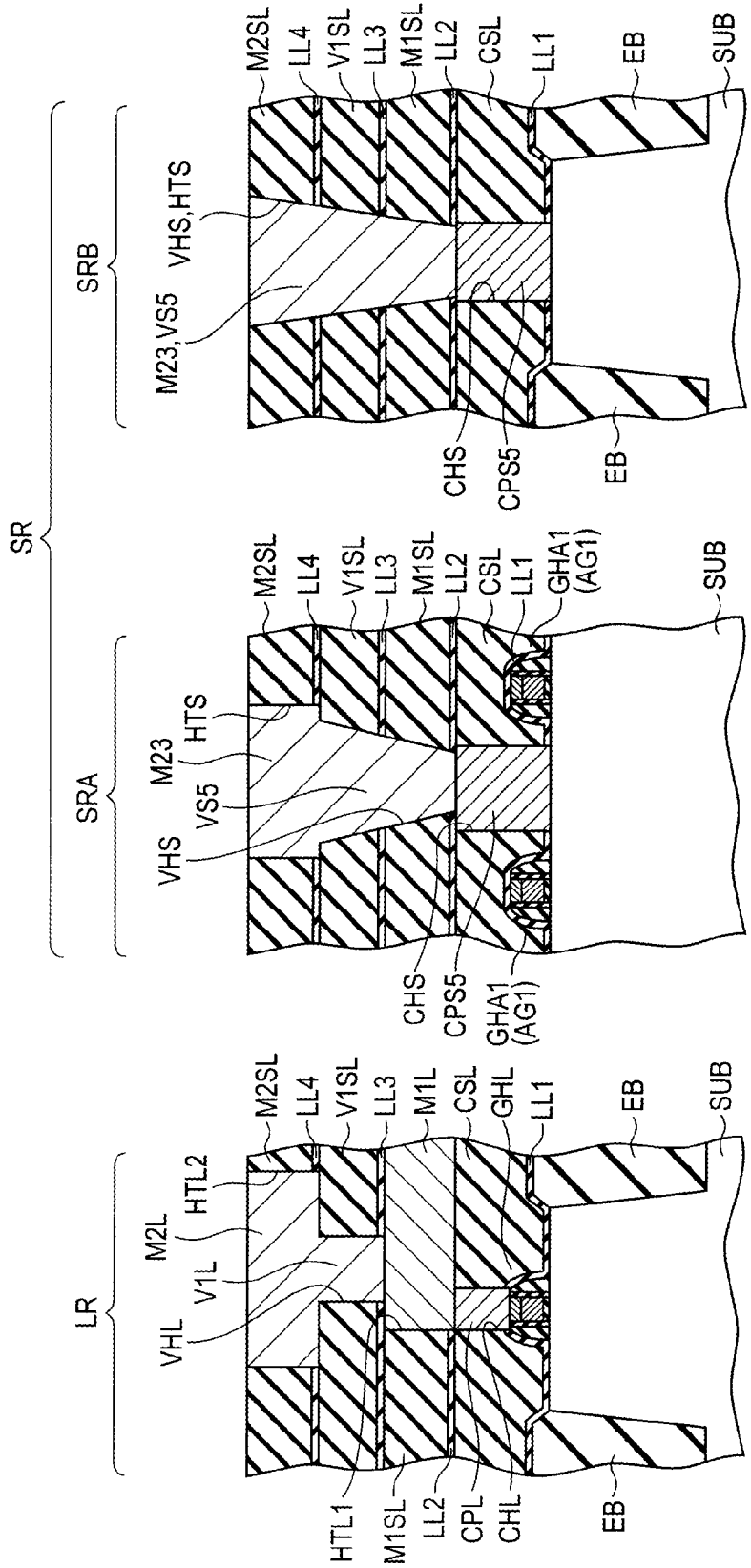
FIG. 43 is a sectional view showing a step to be taken after the step shown in FIG. 42 in the second embodiment.

Next, a copper film is formed by plating or another technique so as to fill the wiring trenches HTS and HTL2, etc. Then, as shown in FIG. 43, a second wiring M23 is formed inside the wiring trench HTS in the memory cell region SR by chemical mechanical polishing of the copper film. Also, in the memory cell region SR, second wirings M21, M22, and M24 to M27 are formed in addition to the second wiring M23 (FIGS. 30 and 32). In the logic circuit region LR, a second wiring M2L is formed inside the wiring trench HTL2.

Next, a liner film (not shown), a V2 interlayer insulating film (not shown), and an M3 interlayer insulating film (not shown) are formed in a way to cover the wirings HTS and HTL2, etc. Next, through a process similar to the above process in which vias and wirings have been formed in the V1 interlayer insulating film V1SL and M2 interlayer insulating film M2SL, vias V21 to V24 (FIG. 32) are made in the V2 interlayer insulating film in the memory cell region SR and third wirings M31 to M33 (FIG. 32) are formed in the M3 interlayer insulating film. Also, prescribed vias and wirings (not shown) are formed in the logic circuit region LR. With the above steps, the main part of the semiconductor device having an SRAM memory cell is formed.

As mentioned earlier, in the semiconductor device of the related art (comparative example), when fabricating a photomask for patterning of a relatively short wiring as the first wiring M15 (M16), it may be impossible to make optical proximity correction adequately due to the relation with other first wirings adjacent to the first wirings M15 and M16. As a consequence, in some cases the first wirings M15 and M16 cannot be formed as desired and the SRAM memory cell cannot function properly.

By contrast, in the semiconductor device (first example) according to this second embodiment, the first wirings M15 and M16 which are formed in the comparative example (FIG. 20) are not formed. Specifically, as shown in FIG. 32, the contact plug CPS5 (CPS6) electrically coupled to the source or drain of the access transistor T1 (T2) is coupled directly to the via VS5 (VS6).

Since the contact plug CPS5 (CPS6) and via VS5 (VS6) are coupled without intervention of the first wiring M15 (M16) (FIG. 20) which is relatively short and may make it difficult to make optical proximity correction adequately, the access transistor T1 (T2) and bit line BL (/BL) are electrically coupled adequately, so the SRAM memory cell can perform its function properly.

In addition, in the semiconductor device according to the first example, as shown in FIG. 29, the process margin in coupling the via VS5 (VS6) to the contact plug CPS5 (CPS6) can be increased by expanding the area of the contact plug CPS5 (CPS6) to be in direct contact with the via VS5 (VS6), in the direction in which the gate wiring part GHA1 (GHA2) of the access transistor T1 (T2) extends.

Furthermore, in the semiconductor device according to the first example, since the first wiring M15 (M16) (FIG. 20) is not formed, there is no need to update the optical proximity correction for each new generation. Consequently the time required to develop a new model can be shortened and cost reduction can be achieved.

SECOND EXAMPLE

The first example has been so far described in which the relatively short first wirings M15 and M16 (FIG. 20) are not formed. Next, the second example will be described in which the relatively short first wirings M13 and M18 (FIG. 20) are not formed.

Figure 44:
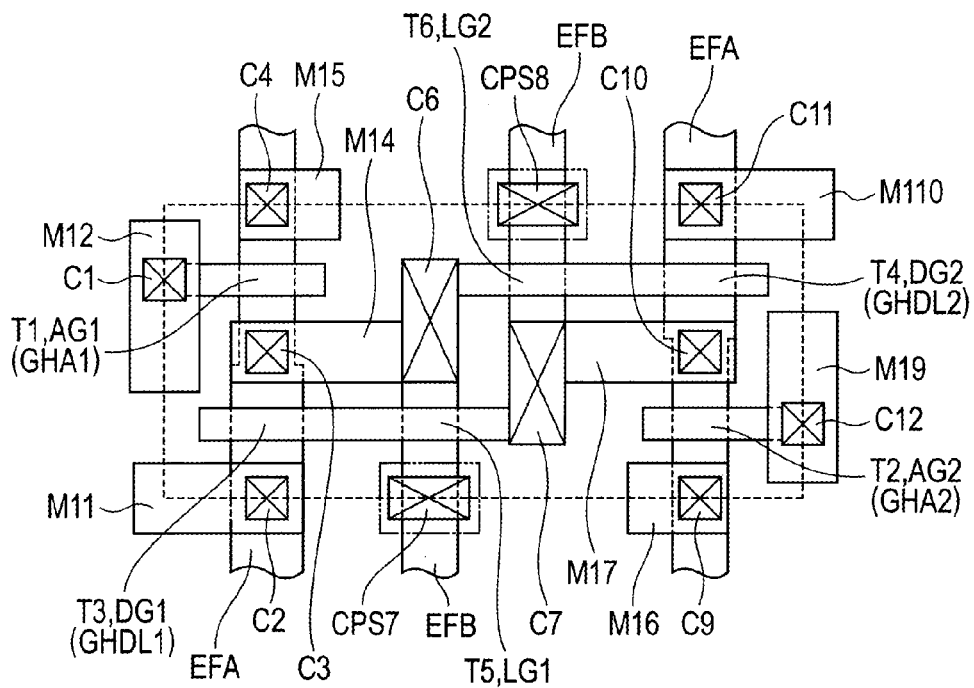
FIG. 44 is a plan view showing how the transistors and first wirings are interconnected in an SRAM memory cell of a semiconductor device according to a second example of the second embodiment of the present invention.
Figure 45:
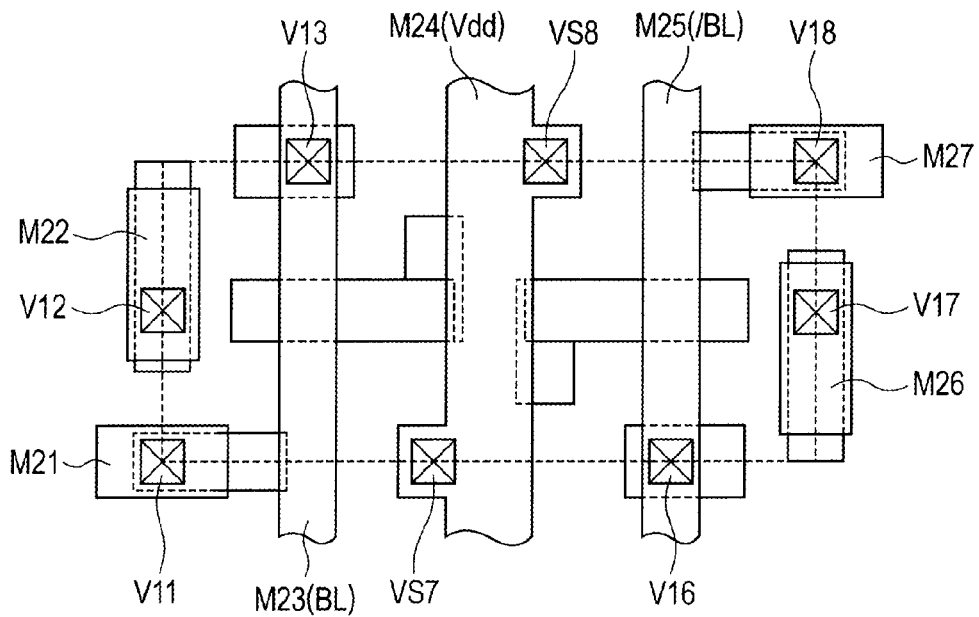
FIG. 45 is a plan view showing how the first and second wirings are interconnected in the second example of the second embodiment.
Figure 46:
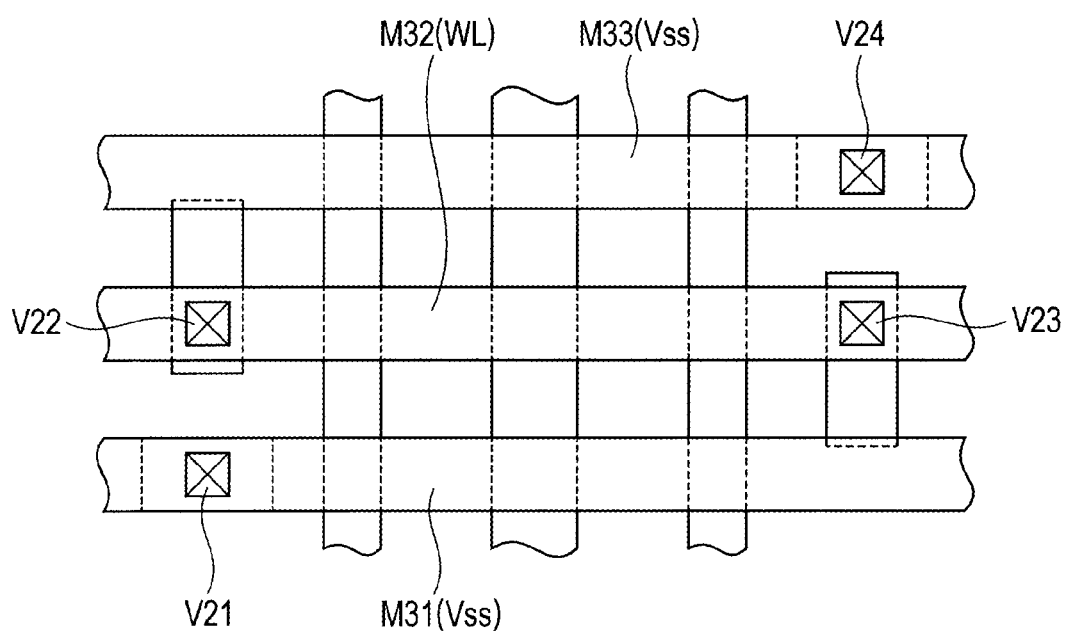
FIG. 46 is a plan view showing how the second and third wirings are interconnected in the second example of the second embodiment.
Figure 47:
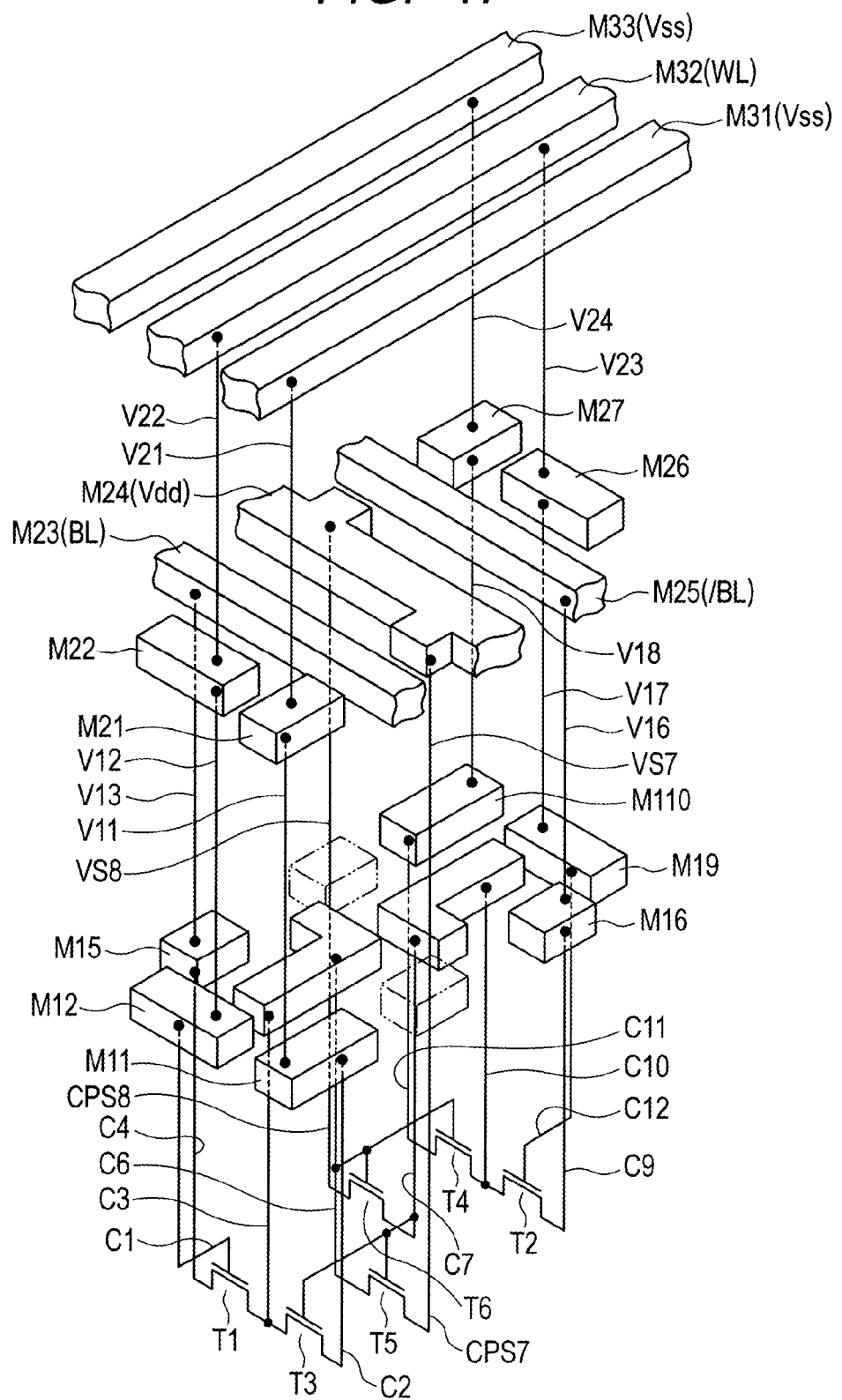
FIG. 47 is an exploded perspective view of the multilayer interconnection structure of the SRAM memory cell in the second example of the second embodiment.

FIG. 44 shows how the transistors and first wirings are interconnected in a memory cell of the semiconductor device according to the second example and FIG. 45 shows how the first and second wirings are interconnected. FIG. 46 shows how the second and third wirings are interconnected and FIG. 47 is an exploded perspective view of the whole multilayer interconnection structure.

As shown in FIGS. 44 to 47, in an SRAM memory cell of this semiconductor device, among the contact plugs coupled to a load transistor T5, a contact plug CPS7 to be coupled to a voltage supply wiring is directly coupled to a via VS7. The via VS7 is electrically coupled to a second wiring M24 as a voltage supply wiring.

Also, among the contact plugs coupled to a load transistor T6, a contact plug CPS8 to be coupled to a voltage supply wiring is directly coupled to a via VS8. The via VS8 is electrically coupled to the second wiring M24 as a voltage supply wiring.

In other words, in this SRAM memory cell, the first wirings for electrically coupling the load transistors and voltage supply wiring, among the first wirings which are formed in the SRAM memory cell according to the comparative example, are not formed. The other constituent elements which are the same as in the semiconductor device according to the first example or second example of the first embodiment are designated by the same reference numerals and descriptions thereof are not repeated.

The method for manufacturing a semiconductor device according to the second example is basically the same as that for the semiconductor device according to the first example except that the photo-mask pattern for the first wirings must be modified.

In the semiconductor device according to the second example, the contact plug CPS7 (CPS8) and via VS7 (VS8) are coupled without intervention of the first wiring M13 (M18) (FIG. 20) which is relatively short and may make it difficult to make optical proximity correction adequately. Consequently, as in the semiconductor device according to the first example, the load transistor T5 (T6) and second wiring M24 as a voltage supply wiring are electrically coupled adequately, so the SRAM memory cell can perform its function properly.

In addition, in the semiconductor device according to the second example, as shown in FIG. 44, the process margin in coupling the via VS7 (VS8) to the contact plug CPS7 (CPS8) can be increased by expanding the area of the contact plug CPS7 (CPS8) to be in direct contact with the via VS7 (VS8), in the direction in which the gate wiring part GHDL1 (GHDL2) of the load transistor T5 (T6) extends.

Furthermore, in the semiconductor device according to the second example, since the first wiring M13 (M18) (FIG. 20) is not formed, there is no need to update the optical proximity correction for each new generation. Consequently the time required to develop a new model can be shortened and cost reduction can be achieved.

THIRD EXAMPLE

As the third example, a semiconductor device which combines the semiconductor device according to the first example and the semiconductor device according to the second example will be described.

Figure 48:
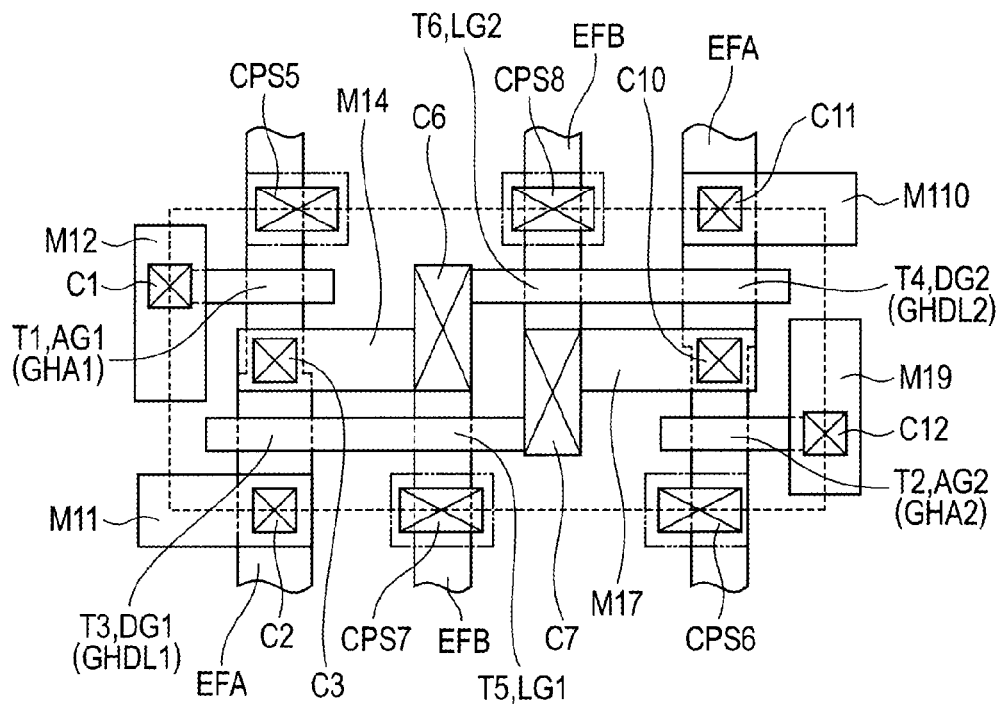
FIG. 48 is a plan view showing how the transistors and first wirings are interconnected in an SRAM memory cell of a semiconductor device according to a third example of the second embodiment of the present invention.
Figure 49:
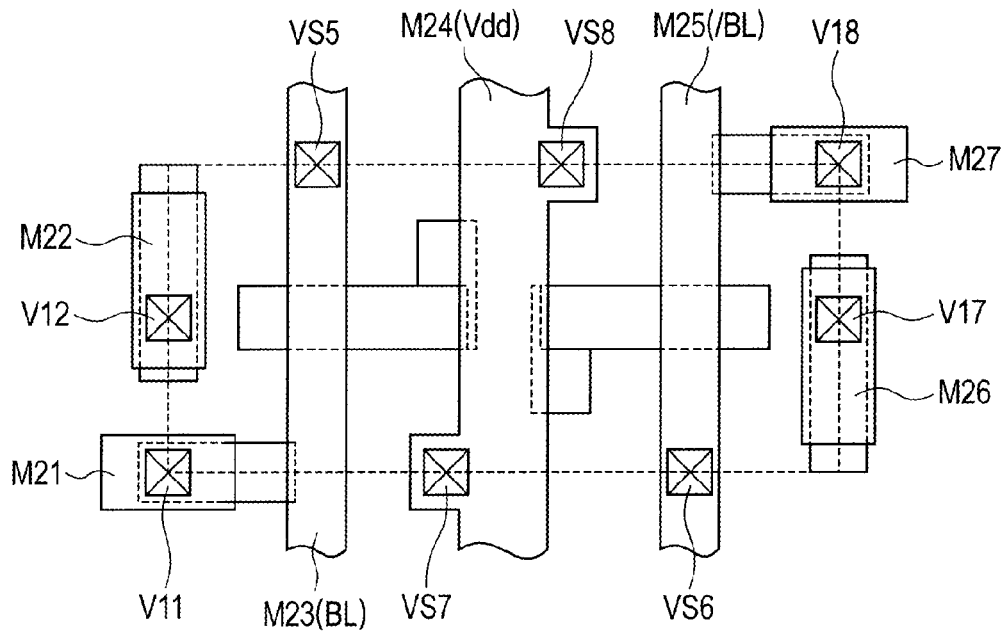
FIG. 49 is a plan view showing how the first and second wirings are interconnected in the third example of the second embodiment.
Figure 50:
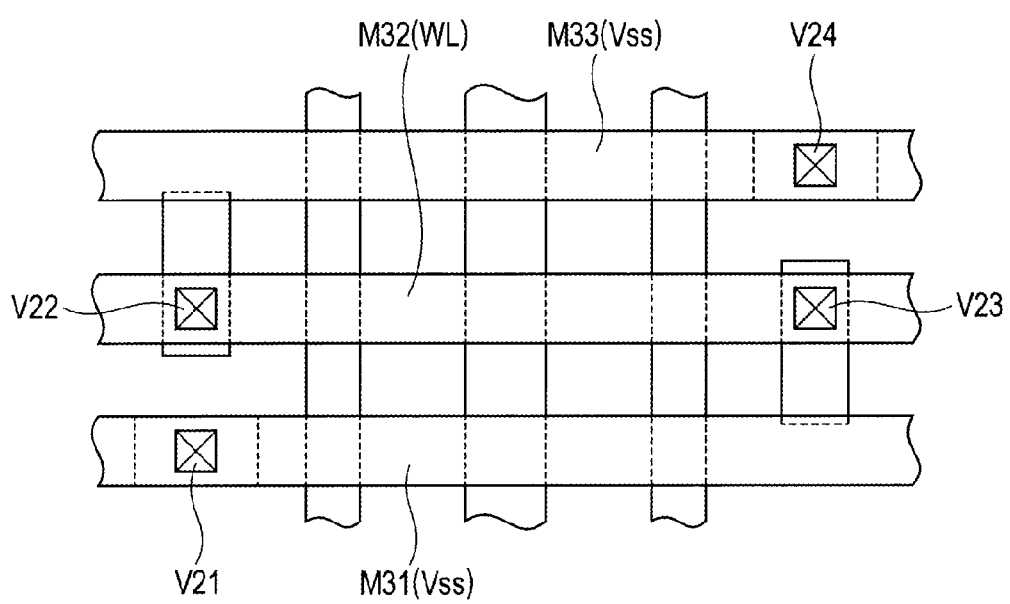
FIG. 50 is a plan view showing how the second and third wirings are interconnected in the third example of the second embodiment.
Figure 51:
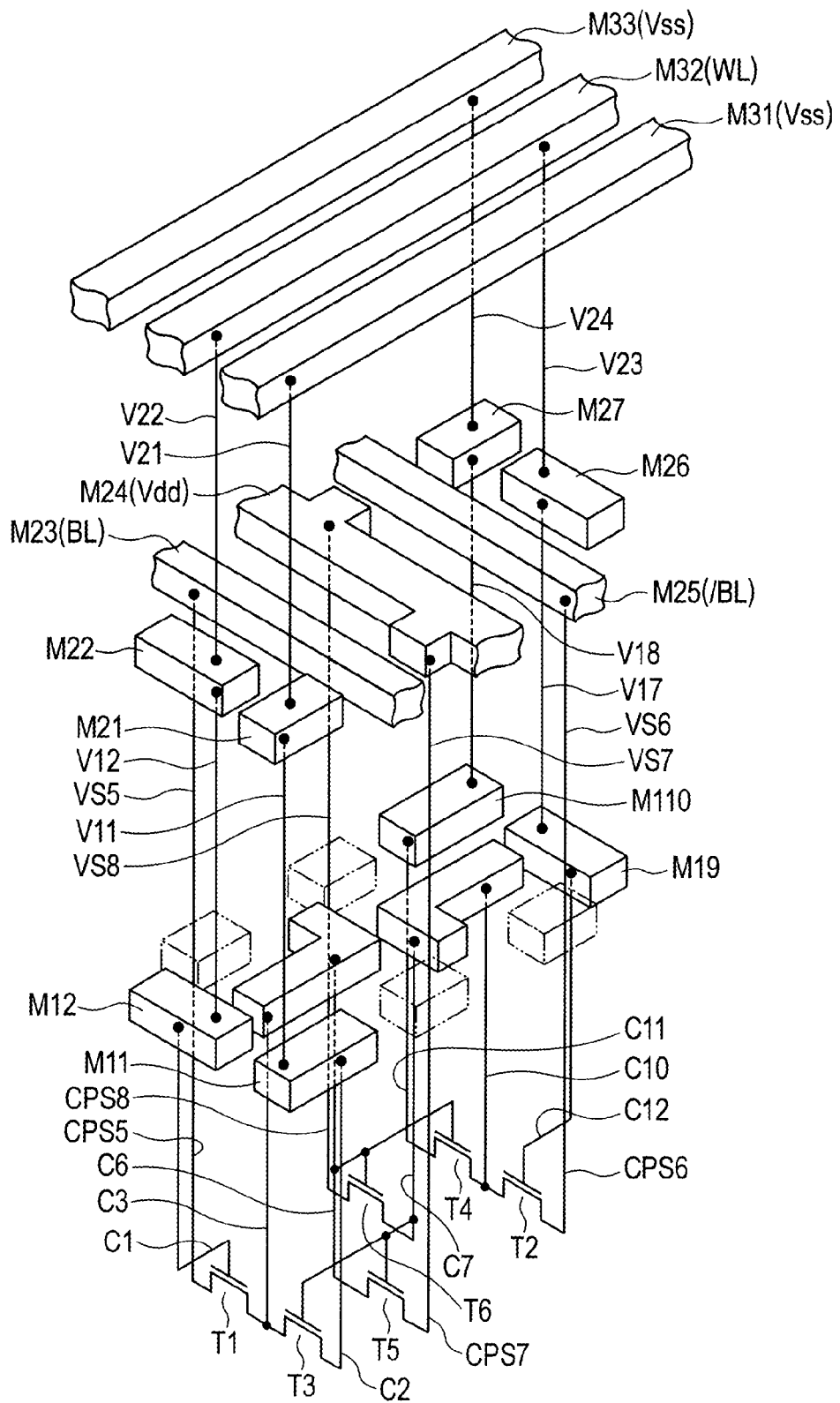
FIG. 51 is an exploded perspective view of the multilayer interconnection structure of the SRAM memory cell in the third example of the second embodiment.

FIG. 48 shows how the transistors and first wirings are interconnected in a memory cell of the semiconductor device according to the third example and FIG. 49 shows how the first and second wirings are interconnected in the third example. FIG. 50 shows how the first and third wirings are interconnected and FIG. 51 is an exploded perspective view of the whole multilayer interconnection structure.

As shown in FIGS. 48 to 51, in the semiconductor device according to the third example, the first wirings M15, M16, M13 and M18 (FIG. 20) which are formed in the semiconductor device according to the comparative example are not formed and the via VS5 (VS6) is directly coupled to the contact plug CPS5 (CPS6) and the via VS7 (VS8) is directly coupled to the contact plug CPS7 (CPS8). The other constituent elements which are the same as in the semiconductor device according to the first or second example of the first embodiment are designated by the same reference numerals and descriptions thereof are not repeated.

The method for manufacturing a semiconductor device according to the third example is basically the same as that for the semiconductor device according to the first example except that the photo-mask pattern for the first wirings must be modified.

In the semiconductor device according to the third example, the contact plug CPS5 (CPS6) and via VS5 (VS6) are coupled without intervention of the first wiring M15 (M16) (FIG. 20) which is relatively short and may make it difficult to make optical proximity correction adequately. Also, the contact plug CPS7 (CPS8) and via VS7 (VS8) are coupled without intervention of the first wiring M13 (M18) (FIG. 20) which is relatively short and may make it difficult to make optical proximity correction adequately.

Consequently, as explained above in connection with the first and second examples, the access transistor T1 (T2) and bit line BL (/BL) are electrically coupled adequately and the load transistor T5 (T6) and second wiring M24 are electrically coupled adequately. Consequently, the SRAM memory cell can perform its function properly.

Furthermore, the process margin in coupling the vias VS5 (VS6) and VS7 (VS8) to the contact plugs CPS5 (CPS6) and CPS7 (CPS8) respectively can be increased by expanding the areas of the contact plug CPS5 (CPS6) and CPS7 (CPS8) in a given direction. Also, there is no need to update the optical proximity correction for each new generation of photo-mask for patterning of first wirings. Consequently the time required to develop a new model can be shortened and cost reduction can be achieved.

FOURTH EXAMPLE

As the fourth example, a semiconductor device which combines the semiconductor device according to the third example of the second embodiment and the semiconductor device according to the third example of the first embodiment will be described.

Figure 52:
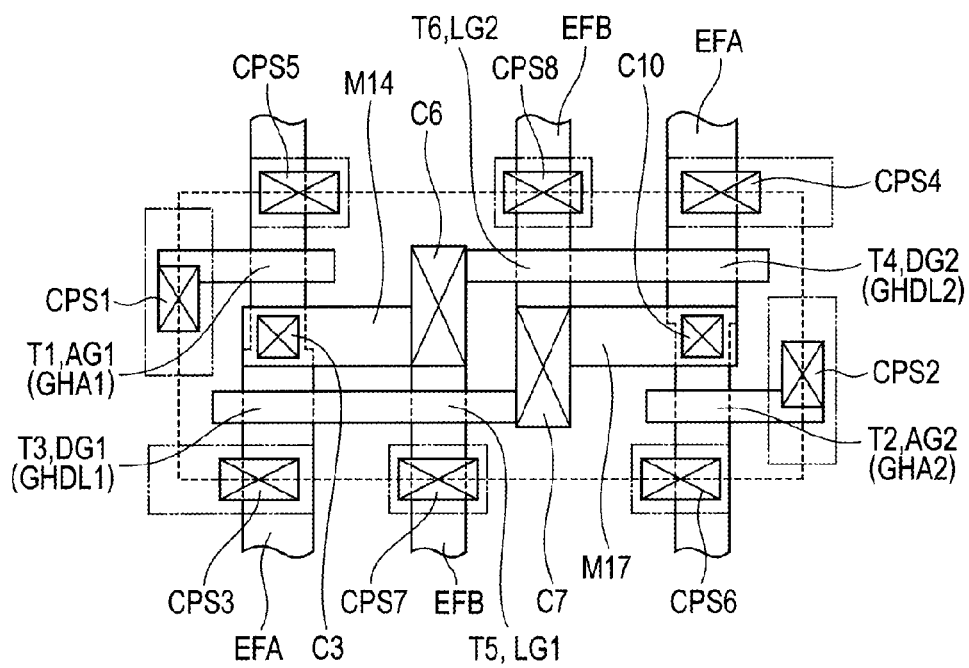
FIG. 52 is a plan view showing how the transistors and first wirings are interconnected in an SRAM memory cell of a semiconductor device according to a fourth example of the second embodiment of the present invention.
Figure 53:
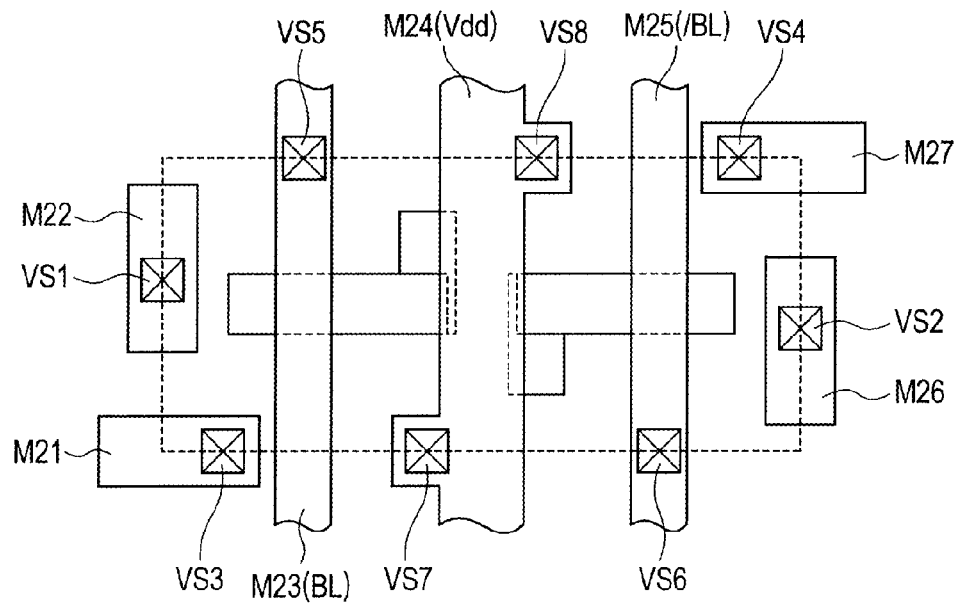
FIG. 53 is a plan view showing how the first and second wirings are interconnected in the fourth example of the second embodiment.
Figure 54:
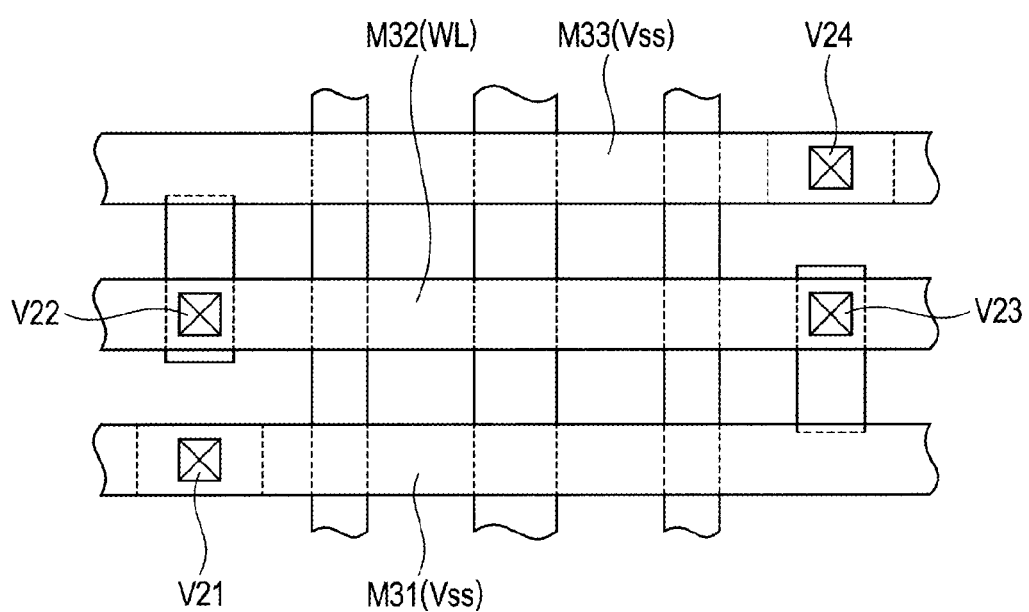
FIG. 54 is a plan view showing how the second and third wirings are interconnected in the fourth example of the second embodiment.
Figure 55:
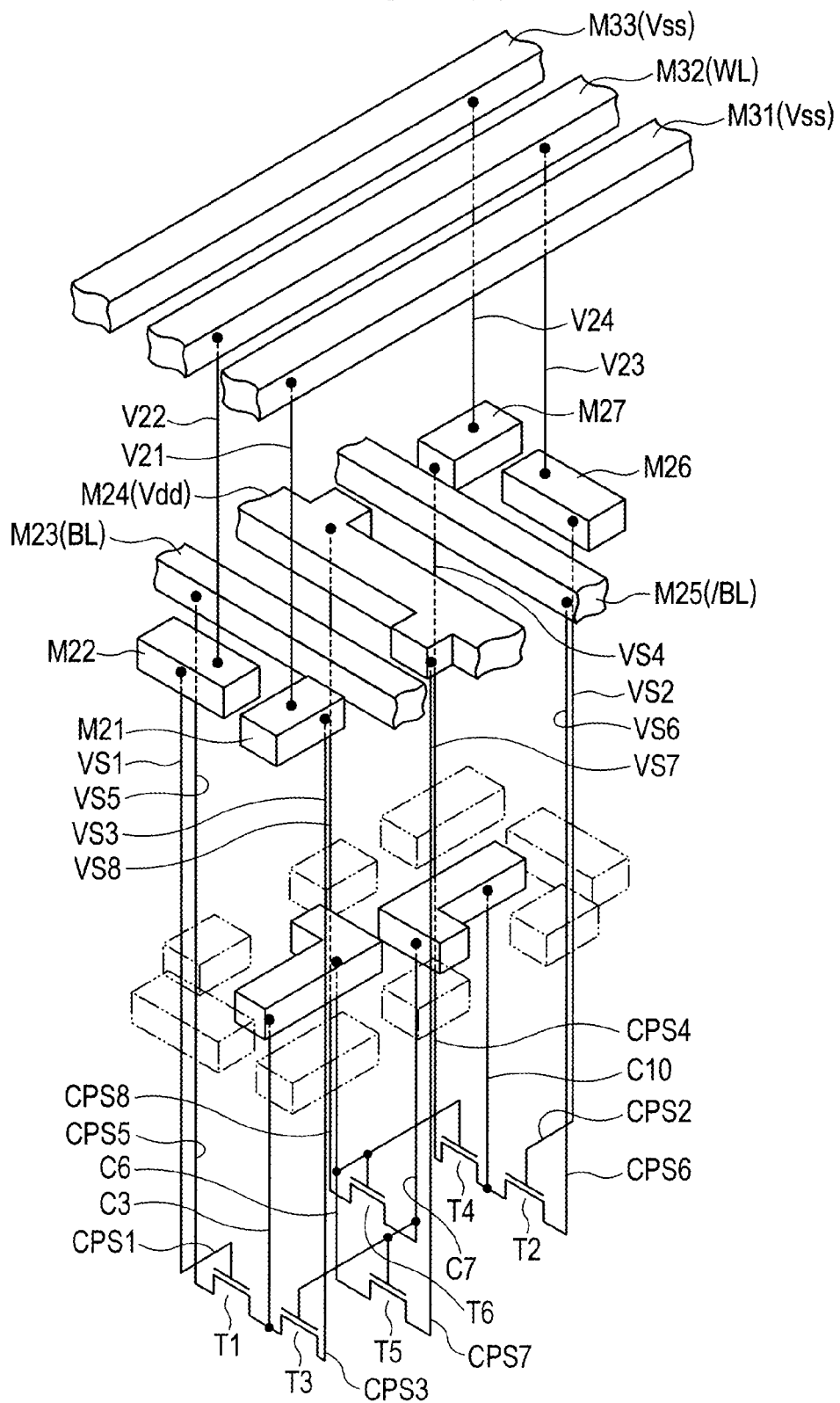
FIG. 55 is an exploded perspective view of the multilayer interconnection structure of the SRAM memory cell in the fourth example of the second embodiment.

FIG. 52 shows how the transistors and first wirings are interconnected in a memory cell of the semiconductor device according to the fourth example and FIG. 53 shows how the first and second wirings are interconnected. FIG. 54 shows how the first and third wirings are interconnected and FIG. 55 is an exploded perspective view of the whole multilayer interconnection structure.

As shown in FIGS. 52 to 55, contact plugs CPS5, CPS6, CPS7, and CPS8 are directly coupled to corresponding vias VS5, VS6, VS7, and VS8 respectively and contact plugs CPS1, CPS2, CPS3, and CPS4 are directly coupled to corresponding vias VS1, VS2, VS3, and VS4 respectively.

Therefore, as discussed so far, the SRAM memory cell can perform its function more effectively. Also, the process margin for the vias corresponding to the contact plugs can be increased. The time required to develop a new model can be shortened and cost reduction can be achieved.

The above embodiments have been described for illustrative but not limitative purposes. The scope of the present invention is defined by the appended claims rather than by the description preceding them, and all changes that fall within metes and bounds of the claims, or equivalence of such metes and bounds are therefore intended to be embraced by the claims.

The present invention is effectively applied to semiconductor devices having SRAM memory cells.

What is claimed is:

1. A semiconductor device having a static random access memory cell, the device comprising:
    a plurality of element formation regions each defined on a main surface of a semiconductor substrate;
    access transistors including a first access transistor and a second access transistor, driver transistors including a first driver transistor and a second driver transistor, and load transistors including a first load transistor and a second load transistor, each formed in a prescribed element formation region of the element formation regions;
    a plurality of contact plugs formed so as to be electrically coupled to prescribed parts of the access transistors, the driver transistors, and the load transistors respectively;
    a plurality of first wirings each formed so as to be electrically coupled to a prescribed contact plug among the contact plugs;
    a plurality of first vias each formed so as to be electrically coupled to a prescribed contact plug among the contact plugs;
    a plurality of second wirings, each formed so as to be electrically coupled to a prescribed first via among the first vias, including a first bit line and a second bit line for inputting and outputting data and a voltage supply wiring; and
    a plurality of third wirings, each formed above and spaced from the second wirings so as to be electrically coupled to a prescribed second wiring among the second wirings, including a word line and a grounding wiring,
    wherein the first access transistor is electrically coupled between a first storage node for storing data and the first bit line, and the second access transistor is electrically coupled between a second storage node for storing data and the second bit line;
    wherein a gate of the first access transistor and a gate of the second access transistor are electrically coupled to the word line;
    wherein the first driver transistor is electrically coupled between the first storage node and the grounding wiring and the second driver transistor is electrically coupled between the second storage node and the grounding wiring;
    wherein the first load transistor is electrically coupled between the first storage node and the voltage supply wiring and the second load transistor is electrically coupled between the second storage node and the voltage supply wiring; and
    wherein among the contact plugs, at least one of a first contact plug located on a side of each of the access transistors for coupling to the bit line and a second contact plug located on a side of each of the load transistors for coupling to the voltage supply wiring and among the first vias, a first via first part for electrically coupling either the first contact plug or the second contact plug to a prescribed second wiring first part among the second wirings are electrically coupled so that the first via first part is in direct contact with either the first contact plug or the second contact plug.

2. The semiconductor device according to claim 1, wherein the first via first part is electrically coupled to the first contact plug so as to be in direct contact therewith.

3. The semiconductor device according to claim 1, wherein the first via first part is electrically coupled to the second contact plug so as to be in direct contact therewith.

4. The semiconductor device according to claim 1, wherein the first via first part is electrically coupled to the first contact plug so as to be in direct contact therewith and electrically coupled to the second contact plug so as to be in direct contact therewith.

5. The semiconductor device according to claim 4,
wherein among the contact plugs, a third contact plug electrically coupled to the gate of the access transistors and among the first vias, a first via second part for electrically coupling the third contact plug and a prescribed second wiring second part among the second wirings are electrically coupled so that the first via second part is in direct contact with the third contact plug; and
wherein among the contact plugs, a fourth contact plug located on a side of the driver transistor for coupling to the grounding wire, and among the first vias, a first via third part for electrically coupling the fourth contact plug and a prescribed second wiring third part among the second wirings are electrically coupled so that the first via third part is in direct contact with the fourth contact plug.

6. The semiconductor device according to claim 1, further comprising an interlayer insulating film with a prescribed dielectric constant in which a wiring trench corresponding to a pattern of the first wirings is formed,
wherein the first wirings are copper wirings formed in the wiring trench.

7. The semiconductor device according to claim 2, further comprising an interlayer insulating film with a prescribed dielectric constant in which a wiring trench corresponding to a pattern of the first wirings is formed,
wherein the first wirings are copper wirings formed in the wiring trench.

8. The semiconductor device according to claim 3, further comprising an interlayer insulating film with a prescribed dielectric constant in which a wiring trench corresponding to a pattern of the first wirings is formed,
wherein the first wirings are copper wirings formed in the wiring trench.

9. The semiconductor device according to claim 4, further comprising an interlayer insulating film with a prescribed dielectric constant in which a wiring trench corresponding to a pattern of the first wirings is formed,
wherein the first wirings are copper wirings formed in the wiring trench.

10. The semiconductor device according to claim 5, further comprising an interlayer insulating film with a prescribed dielectric constant in which a wiring trench corresponding to a pattern of the first wirings is formed,
wherein the first wirings are copper wirings formed in the wiring trench.

\* \* \* \* \*